United States Patent [19]

Kajimoto et al.

[11] Patent Number: 5,506,548

[45] Date of Patent: Apr. 9, 1996

[54] SSB MODULATOR FOR ADJUSTING THE CARRIER AMPLITUDE LEVEL OF A MODULATED SSB SIGNAL

[75] Inventors: Shigeki Kajimoto, Osaka; Weimin Sun, Nara, both of Japan

[73] Assignee: Icom Incorporated, Osaka, Japan

[21] Appl. No.: 313,878

[22] Filed: Sep. 28, 1994

[30] Foreign Application Priority Data

Sep. 29, 1993 [JP] Japan .................................. 5-242847

[51] Int. Cl.$^6$ ..................................................... H03C 1/60
[52] U.S. Cl. .......................... 332/170; 375/301; 455/109
[58] Field of Search ..................................... 332/167–169, 332/170–171; 375/301; 455/46, 47, 48, 109

[56] References Cited

U.S. PATENT DOCUMENTS 2,722,682  11/1955  Neiswinter ................................ 455/47

OTHER PUBLICATIONS

Japanese Patent Application No. 5-197466, Abstract, "Digital Modulation and Demodulation System", Shigeki Kajimoto et al., Aug. 9, 1993.
Proceedings of the 1993 IEICE fall conference, vol. 1 A–75, Sun, W. et al "An Available Multirate Processing for SSB Modulation–Demodulation and Its Implementation on DSP", Sep. 5–8, 1993.
QEX Magazine, "The Fourth Method: Generating and Detecting SSB Signals", D. K. Van Greas, Sep. 1990, pp. 7–13.
HAM Journal Magazine, "The Merigo Method: SSB Generator/Producing A Demodulator", Yasuo Nozawa, Jul./Aug. 1993, pp. 20–30.

Primary Examiner—David Mis
Attorney, Agent, or Firm—Wenderoth, Lind & Ponack

[57] ABSTRACT

A Single-Sideband (SSB) modulator includes:
a demultiplexer for successively distributing an A/D converted digital signal x(t) to L sequences $x_1(t_1)$, $x_2(t_2)$...$x_L(t_L)$ in accordance with a sampling period t, an adder including L/2 adders for adding constants to $x_i(t_i)$ of the demultiplexer, where i is either an even or an odd number; a phase shift network system comprising L/2 phase shift networks for making a 90-degree phase difference between the outputs of the adder and $x_i(t_i)$ of the demultiplexer; a timing signal generator for generating timing signals expressed by $A(-1)^{(KL)/2+n}$ and/or $A(-1)^{((K-1)L)/2+n}$ in accordance with the sampling period t; a multiplier including L/2 pair of multipliers for multiplying the outputs of the phase shift network system by the outputs of the timing signal generator; a multiplexer for selecting the outputs of the multiplier in accordance with the sampling period t.

7 Claims, 10 Drawing Sheets

SSB MODULATOR FOR ADJUSTING THE CARRIER AMPLITUDE LEVEL OF A MODULATED SSB SIGNAL

BACKGROUND OF THE INVENTION

1. Field of the Invention

The present invention relates to a single-sideband (referred to as SSB hereinafter modulator. More particularly, the present invention relates to a digital SSB modulator capable of adjusting the carrier amplitude level of the modulated SSB signal.

2. Description the Related Art

It is known that one analog SSB modulation method with an adjustable carrier level shifts the frequency of the carrier to an passband of an SSB filter.

However, in this case, since the unwanted sideband overlaps with the passband of the SSB filter, the suppression of the unwanted sideband becomes poor, especially in a low-frequency range. Another method for obtaining an adjustable carrier level is adding a fixed carrier to a suppressed carrier SSB signal.

However, it is very complicated to adjust the carrier frequency and the carrier level in this case, and the carrier frequency and the carrier level may change following the passage of time. The disadvantages of the analog SSB modulation methods noted above can almost be overcome by using digital signal processing. In the digital processing, in order to increase operation accuracy, the sampling frequency is set as high as desired.

However, in this case there isn't have enough time to finish the complicated arithmetic operation. For solving this problem, multi-rate processing is usually used to reduce the sampling frequency to 1/L by decimeter 101, as shown in FIG. 13, where L is a positive number.

In the digital modulator shown in FIG. 13, at first, a digital signal is produced by sampling an analog signal at a sampling frequency fs.

The digital signal is filtered by an LPF and is decimated by L in the decimeter 101 and then, input to a phase shift network 102. Two signals which have a 90-degree phase difference are produced by the phase shift network (referred to as a PSN hereinafter) 102 and interpolated in an interpolator 103.

Then, the two obtained signals are input to two LPFs and the output signals of the two LPFs are respectively multiplied by carrier signals which are generated by carrier signal generators 104 and 105. The two obtained signals are added in an adder 106 to produce a suppressed carrier SSB signal. A carrier whose level can be adjusted is added to the SSB signal by an adder 107 and then, the SSB signal is converted from a digital signal to an analog signal so that a low carrier level SSB signal, a full carrier level SSB signal or a RZ-SSB signal can be obtained.

However, if the sampling frequency is set as high as desired for improving the operation accuracy in the digital processing, the operation efficiency in the digital signal processor becomes poor since at least two sampling frequencies fs and fs/L are involved in the digital signal processing which are brought about by the decimation and interpolation.

Furthermore, the modulation characteristics are affected by the quantum error (round off error) of the LPFs which are used in the decimation and interpolation.

SUMMARY OF THE INVENTION

It is an object of the present invention to provide an SSB modulator which has a good processing efficiency and in which the characteristics of the modulation are not affected by decimation and interpolation.

To achieve the above object, an SSB modulator in accordance with this invention comprises: a demultiplexer means for successively distributing an A/D converted digital signal $x(t)$ to L sequences $x_1(t_1), x_2(t_2)...\ ...x_L(t_L)$ in accordance with a sampling period t, wherein $$x_1(t_1) = x(t) \qquad t_1 = [(t-1)/L]$$
$$x_2(t_2) = x(t) \qquad t_2 = [(t-2)/L]$$
$$...$$
$$x_L(t_L) = x(t) \qquad t_L = [(t-L)/L]$$

and [.] expresses a positive integer number;

an adding means comprising L/2 adders for adding constants to $x_i(t_i)$ of the demultiplexer means, where i is either an even or an odd number;

a phase shift network system means comprising L/2 phase shift networks for making a 90-degree phase difference between the outputs of the adding means and $x_i(t_i)$ of the demultiplexer means, where i is either an odd or an even number;

a timing signal generating means for generating timing signals expressed by:

$$A(-1)^{(KL)/2+n} \qquad (1)$$

and/or $$A(-1)^{((K-1)L)/2+n} \qquad (2)$$

in accordance with the sampling period t;

a multiplying means comprising L/2 pair of multipliers for multiplying the outputs of the phase shift network system means by the outputs of the timing signal generating means;

a multiplexer means for selecting the outputs of the multiplying means in accordance with the sampling period t.

An SSB modulator in accordance with this invention may also comprise:

a demultiplexer means for successively distributing an A/D converted digital signal $x(t)$ to L sequences $x_1(t_1), x_2(t_2)...\ ...x_L(t_L)$ in accordance with a sampling period t, wherein $$x_1(t_1) = x(t) \qquad t_1 = [(t-1)/L]$$
$$x_2(t_2) = x(t) \qquad t_2 = [(t-2)/L]$$
$$...$$
$$x_L(t_L) = x(t) \qquad t_L = [(t-L)/L]$$

and [.] expresses a positive integer number;

a phase shift network system means comprising L/2 phase shift networks for making a 90-degree phase difference between $x_{2j-1}(t_{2j-1})$ and $x_{2j}(t_{2j})$, where j=1,2,... ...L/2;

an adding means comprising L/2 adders for adding constants to one of two kinds of outputs of the phase shift network system means;

a timing signal generating means for generating timing signals expressed by:

$$A(-1)^{(KL)/2+n} \qquad (1)$$

and/or $$A(-1)^{((K-1)L)/2+n} \quad (2)$$

in accordance with the sampling period t;

a multiplying means comprising L/2 pair of multipliers for multiplying the outputs of the adding means and the other of the two kinds of outputs of the phase shift network system means by the outputs of the timing signal generating means;

a multiplexer means for selecting the outputs of the multiplying means in accordance with the sampling period t.

An SSB modulator in accordance with this invention may also comprise:

a demultiplexer means for successively distributing an A/D converted digital signal x(t) to L sequences $x_1(t_1)$, $x_2(t_2)$... ...$x_L(t_L)$ in accordance with a sampling period t, wherein $x_1(t_1) = x(t) \quad t_1 = [(t-1)/L]$
$x_2(t_2) = x(t) \quad t_2 = [(t-2)/L]$
...
$x_L(t_L) = x(t) \quad t_L = [(t-L)/L]$ and [.] expresses a positive integer number;

a phase shift network system means comprising L/2 phase shift networks for making a 90-degree phase difference between $x_{2j-1}(t_{2j-1})$ and $x_{2j}(t_{2j})$, where j=1,2,... ...L/2;

a timing signal generating means for generating timing signals expressed by:

$$A(-1)^{(KL)/2+n} \quad (1)$$

and/or $$A(-1)^{((K-1)L)/2+n} \quad (2)$$

in accordance with the sampling period t;

a first multiplying means comprising L/2 pair of multipliers for multiplying the two kinds of outputs of the phase shift network system means by the outputs of the timing signal generating means;

a second multiplying means comprising a multiplier for multiplying a constant by one of the outputs of the timing signal generating means;

an adding means comprising L/2 adders for adding one of the two kinds of outputs of the first multiplying means to the output of the second multiplying means;

a multiplexer means for selecting the other of the two kinds of outputs of the first multiplying means and the outputs of the adding means in accordance with the sampling period t.

An SSB modulator in accordance with this invention may also comprise:

a demultiplexer means for successively distributing an A/D converted digital signal x(t) to L sequences $x_1(t_1)$, $x_2(t_2)$... ...$x_L(t_L)$ in accordance with a sampling period t, wherein $x_1(t_1) = x(t) \quad t_1 = [(t-1)/L]$
$x_2(t_2) = x(t) \quad t_2 = [(t-2)/L]$
...
$x_L(t_L) = x(t) \quad t_L = [(t-L)/L]$ and [.] expresses a positive integer number;

an adding means comprising L/2 adders for adding constants to $x_i(t_i)$ of the demultiplexer means, where i is either an even or an odd number;

a phase shift network system means comprising L/2 phase shift networks for making a 90-degree phase difference between the outputs of the adding means and $x_i(t_i)$ of the demultiplexer means, where i is either an odd or an even number;

a timing signal generating means for generating timing signals expressed by $$\{1+(-1)^{(KL)/2+n}\}/2 \quad (3)$$

and/or $$\{1+(-1)^{((K-1)L)/2+n}\}/2 \quad (4)$$

in accordance with the sampling period t;

a control means comprising L/2 pair of control circuits for controlling the signs of the two kinds of outputs of the phase shift network system means in accordance with the outputs of the timing signal generating means;

a multiplexer means for selecting the outputs of the control means in accordance with the sampling period t.

An SSB modulator in accordance with this invention may also comprise:

a demultiplexer means for successively distributing an A/D converted digital signal x(t) to L sequences $x_1(t_1)$, $x_2(t_2)$... ...$x_L(t_L)$ in accordance with a sampling period t, wherein $x_1(t_1) = x(t) \quad t_1 = [(t-1)/L]$
$x_2(t_2) = x(t) \quad t_2 = [(t-2)/L]$
...
$x_L(t_L) = x(t) \quad t_L = [(t-L)/L]$ and [.] expresses a positive integer number;

a phase shift network system means comprising L/2 phase shift networks for making a 90-degree phase difference between $x_{2j-1}(t_{2j-1})$ and $x_{2j}(t_{2j})$, where j=1,2,... ...L/2;

an adding means comprising L/2 adders for adding constants to one of the two kinds of outputs of the phase shift network system means;

a timing signal generating means for generating timing signals expressed by:

$$\{1+(-1)^{(KL)/2+n}\}/2 \quad (3)$$

and/or $$\{1+(-1)^{((K-1)L)/2+n}\}/2 \quad (4)$$

in accordance with the sampling period t;

a control means comprising L/2 pair of control circuits for controlling the signs of the other of the two kinds of outputs of the phase shift network system means and the outputs of the adding means in accordance with the outputs of the timing signal generating means;

a multiplexer means for selecting the outputs of the control means in accordance with the sampling period t.

An SSB modulator in accordance with this invention may also comprise:

a demultiplexer means for successively distributing an A/D converted digital signal x(t) to L sequences $x_1(t_1)$, $x_2(t_2)$... ...$x_L(t_L)$ in accordance with a sampling period t, wherein $x_1(t_1) = x(t) \quad t_1 = [(t-1)/L]$ $x_2(t_2) = x(t) \quad t_2 = [(t-2)/L]$

...

$x_L(t_L) = x(t) \quad t_L = [(t-L)/L]$ and [.] expresses a positive integer number;

a phase shift network system means comprising L/2 phase shift networks for making a 90-degree phase difference between $x_{2j-1}(t_{2j-1})$ and $x_{2j}(t_{2j})$, where j=1,2,... ...L/2;

a timing signal generating means for generating timing signals expressed by $$A(-1)^{(KL)/2+n} \quad (1)$$

and/or $$A(-1)^{((K-1)L)/2+n} \quad (2)$$

in accordance with the sampling period t;

a multiplying means comprising L/2 pair of multipliers for multiplying the two kinds of outputs of the phase shift network system means by the outputs of the timing signal generating means;

an adding means comprising L/2 adders for adding one of the two kinds of outputs of the multiplying means to one of the outputs of the timing signal generating means;

a multiplexer means for selecting the other of the two kinds of outputs of the multiplying means and the outputs of the adding means in accordance with the sampling period t.

An SSB modulator in accordance with this invention may also comprise:

a demultiplexer means for successively distributing an A/D converted digital signal x(t) to L sequences $x_1(t_1)$, $x_2(t_2)$... ...$x_L(t_L)$ in accordance with a sampling period t, wherein $x_1(t_1) = x(t) \quad t_1 = [(t-1)/L]$ $x_2(t_2) = x(t) \quad t_2 = [(t-2)/L]$

...

$x_L(t_L) = x(t) \quad t_L = [(t-L)/L]$ and [.] expresses a positive integer number;

a phase shift network system means comprising L/2 phase shift networks for making a 90-degree phase difference between $x_{2j-1}(t_{2j-1})$ and $x_{2j}(t_{2j})$, where j=1,2,... ...L/2;

a timing signal generating means for generating timing signals expressed by $$A(-1)^{(KL)/2+n} \quad (1)$$

and/or $$A(-1)^{((K-1)L)/2+n} \quad (2)$$

in accordance with the sampling period t;

a multiplying means comprising L/2 pair of multipliers for multiplying the two kinds of outputs of the phase shift network system means by the outputs of the timing signal generating means;

a bit shift means for shifting the bit of one of the outputs of the timing signal generating means;

an adding means comprising L/2 adders for adding one of the two kinds of outputs of the multiplying means to the outputs of the bit shift means;

a multiplexer means for selecting the other of the two kinds of outputs of the multiplying means and the outputs of the adding means in accordance with the sampling period t.

Through all the claims, [(t−1)/L],[(t−2)/L],... ...,[(t−L)/L] are positive integer numbers, A represents a fixed number, L represents an even number indicating the number of outputs of the demultiplexer means, n represents the number of phase shift networks and pair of multipliers (n=1 to L/2), K represents number of periods of distributing by the demultiplexer means, and t represents the sampling period (t=1,2,3 ...).

In the first above-noted SSB modulator, the demultiplexer means successively distributes the A/D converted digital signal x(t) to L sequences $x_1(t_1)$, $x_2(t_2)$... ...$x_L(t_L)$ in accordance with a sampling period t, wherein $x_1(t_1) = x(t) \quad t_1 = [(t-1)/L]$ $x_2(t_2) = x(t) \quad t_2 = [(t-2)/L]$

...

$x_L(t_L) = x(t) \quad t_L = [(t-L)/L]$ and [.] expresses a positive integer number.

L/2 sequences $x_i(t_i)$ are input to the adding means which comprises L/2 adders, wherein i is either an even number or an odd number.

The outputs of the adding means are input to the phase shift network system means which comprises L/2 the phase shift networks.

The rest of L/2 sequences $x_i(t_i)$ are directly input to the phase shift network system means, i is either an odd number or an even number.

The two kinds of signals are made to have a 90-degree phase difference by the phase shift network system means. The two kinds of outputs from the phase shift network system means are input to the multiplying means which comprises L/2 pair of the multipliers.

In the multiplying means, the two kinds of signals which have a 90-degree phase difference are multiplied by the two timing signals respectively which are different or identical as expressed by:

$$A(-1)^{(KL)/2+n}$$

and/or $$A(-1)^{((K-1)L)/2+n}$$

The outputs of the multiplying means are selected by the multiplexer means and delivered in a sequence in accordance with the sampling period t.

More particularly, the demultiplexer means delivers x(1) through the 1st sequence, x(2) through the 2nd sequence, and ... ... the L-th x(L) through the L-th sequence, (L+1)-th x(L+1) through the 1st sequence (L+2)-th x(L+2) through the 2nd sequence, ... .

For example, the delivered digital signal in the 1st sequence is $x_1(t_1)$ as denoted by:

$$x_1(t_1) = \{x(1), x(L+1), x(2L+1), \ldots \ldots\}$$

The delivered digital signal in the 2nd sequence is $x_2(t_2)$ as denoted by:

$$x_2(t_2) = \{x(2), x(L+2), x(2L+2), \ldots \ldots\}$$

The delivered digital signal in 2nd sequence $x_2(t_2)$ (or the delivered digital signal $x_1(t_1)$) from the demultiplexer means is input to the 1st adder for adding a constant B.

The delivered digital signal in 1st sequence $x_1(t_1)$ (or the delivered digital signal $x_2(t_2)$) is directly input to the 1st phase shift network.

The two signals $x_1(t_1)$ and $x_2(t_2)$+B (or $x_1(t_1)$+b and $x_2(t_2)$) are made to have a 90-degree phase difference by the 1st phase shift network.

The two outputs $y_1$ and $y_2$ of the 1st phase shift network which have a 90-degree phase difference are input to the 1st pair of the multipliers.

In the 1st pair of the multipliers, the two outputs $y_1$ and $y_2$ which have a 90-degree phase difference are multiplied by the two timing signals respectively which are different or identical as expressed by:

$$A(-1)^{(KL)/2+1}$$

and/or $$A(-1)^{((K-1)L)/2+1}$$

The two outputs $z_1$ and $z_2$ of the 1st pair of the multipliers are input to the multiplexer means.

The delivered digital signal in the (L−1)-th sequence is $x_{L-1}(t_{L-1})$ as denoted by:

$$x_{L-1}(t_{L-1}) = \{x(L-1), x(2L-1), x(3L-1), \ldots \ldots\}$$

The delivered digital signal in the L-th sequence is $x_L(t_L)$ as denoted by:

$$x_L(t_L) = \{x(L), x(2L), x(3L), \ldots \ldots\}$$

The delivered digital signal in the L-th sequence x L (t L)(or the delivered digital signal $x_{L-1}(t_{L-1})$) is input to the L/2-th adder for adding a constant B.

The delivered digital signal in (L−1)-th sequence $x_{L-1}(t_{L-1})$ (or the digital signal $x_L(t_L)$) is directly input to the L/2-th phase shift network.

The two signals $x_{L-1}(t_{L-1})$ and $x_L(t_L)$+B (or $x_{L-1}(t_{L-1})$+B and $x_L(t_L)$) are made to have a 90-degree difference by the L/2-th phase shift networks.

The two outputs $y_{L-1}$ and $y_L$ from the L/2-th phase shift network which have a 90-degree phase difference are input to L/2-th pair of the multipliers.

In the L/2-th pair of the multipliers, the outputs $y_{L-1}$ and $y_L$ which have a 90-degree phase difference are multiplied by the two timing signals respectively which are different or identical as expressed by:

$$A(-1)^{(KL)/2+1}$$

and/or $$A(-1)^{((K-1)L)/2+(L/2)}$$

The two outputs $z_{L-1}$ and $z_2$ of the L/2-th pair of the multipliers are input to the multiplexer means.

The output signals $z_1, z_2, \ldots \ldots, $ and $z_{L-1}$ from the 1st to the L/2-th pair of the multipliers are selected in accordance with the sampling period t.

In the second above-noted SSB modulator, the demultiplexer means successively distributes the A/D converted digital signal x(t) to L sequences $x_1(t_1), x_2(t_2) \ldots \ldots x_L(t_L)$ in accordance with a sampling period t, wherein $$x_1(t_1) = x(t) \qquad t_1 = [(t-1)/L]$$
$$x_2(t_2) = x(t) \qquad t_2 = [(t-2)/L]$$
$$\ldots$$
$$x_L(t_L) = x(t) \qquad t_L = [(t-L)/L]$$

and [.] expresses a positive integer number.

The two kinds of signals $x_{2j-1}(t_{2j-1})$ and $x_{2j}(t_{2j})$ from the demultiplexer means are input to the phase shift network system means which comprises L/2 the phase shift networks, where j=1,2,...L/2. The two kinds of signals are made to have a 90-degree phase difference by the phase shift network system means.

One of the two kinds of outputs from the phase shift network system means are input to the adding means which comprises L/2 the adders.

The outputs of the adding means are input to the multiplying means which comprises L/2 pair of the multipliers. The other of the two kinds of outputs from the phase shift network system means are directly input to the multiplying means.

In the multiplying means, the two kinds of signals which have a 90-degree phase difference are multiplied by the two timing signals respectively which are different or identical as expressed by:

$$A(-1)^{(KL)/2+n}$$

and/or $$A(-1)^{((K-1)L)/2+n}$$

The outputs of the multiplying means are selected by the multiplexer means in accordance with the sampling period t.

More particularly, the demultiplexer means delivers x(1) through the 1st sequence, x(2) through the 2nd sequence, and ... ... the L-th x(L) through the L-th sequence, (L+1)-th x(L+1) through the 1st sequence, ... ... .

For example, the delivered digital signal in the 1st sequence is $x_1(t_1)$ as denoted by:

$$x_1(t_1) = \{x(1), x(L+1), x(2L+1), \ldots \ldots\}$$

The delivered digital signal in the 2nd sequence is $x_2(t_2)$ as denoted by:

$$x_2(t_2) = \{x(2), x(L+2), x(2L+2), \ldots \ldots\}$$

The two outputs $x_1(t_1)$, $x_2(t_2)$ from the demultiplexer means are input to the 1st phase shift network to make a 90-degree phase difference between the two signals.

One of the two outputs $y_1$ and $y_2$ from the 1st phase shift network is input to the 1st adder, the output of the 1st adder and the other of the two outputs $y_1$ and $y_2$ are input to the 1st pair of the multipliers for multiplying the two timing signals respectively which are different or identical as expressed by:

$$A(-1)^{(KL)/2+1}$$

and/or $$A(-1)^{((K-1)L)/2+1}$$

The outputs $z_1$ and $z_2$ of the 1st pair of the multipliers are input to the multiplexer means.

The delivered digital signal in the (L+1)-th sequence is $x_{L-1}(t_{L-1})$ as denoted by:

$$x_{L-1}(t_{L-1})=\{x(L-1),x(2L-1),x(3L-1),\ldots\ldots\}$$

The delivered digital signal in the L-th sequence is $x_L(t_L)$ as denoted by:

$$x_L(t_L)=\{x(L),x(2L),x(3L),\ldots\ldots\}$$

The two outputs $x_{L-1}(t_{L-1})$ and $x_L(t_L)$ from the demultiplexer means are input to the L/2-th phase shift network to make a 90-degree phase difference between the two signals.

One of the two outputs $y_{L-1}$ and $y_L$ from the L/2-th phase shift network is input to the L/2-th adder, the output of the L/2-th adder and the other of the two outputs $y_1$ and $y_2$ are input to the L/2-th pair of the multipliers for multiplying the two timing signals respectively which are different or identical as expressed by:

$$A(-1)^{(KL)/2+(L/2)}$$

and/or $$A(-1)^{((K-1)L)/2+(L/2)}$$

The outputs $z_{L-1}$ and $z_L$ of the L/2-th pair of the multipliers are input to the multiplexer means.

The output signals $z_1,z_2,\ldots,z_{L-1}$, and $z_L$ from the 1st to the L/2-th pair of the multipliers are selected in accordance with the sampling period t.

In the third above-noted SSB modulator, the demultiplexer means successively distributes the A/D converted digital signal x(t) to L sequences $x_1(t_1), x_2(t_2)\ldots\ldots x_L(t_L)$ in accordance with a sampling period t, wherein $$x_1(t_1) = x(t) \quad t_1 = [(t-1)/L]$$
$$x_2(t_2) = x(t) \quad t_2 = [(t-2)/L]$$
$$\ldots$$
$$x_L(t_L) = x(t) \quad t_L = [(t-L)/L]$$

and [.] expresses a positive integer number.

The two kinds of signals $x_{2j-1}(t_{2j-1})$ and $x_{2j}(t_{2j})$ from the demultiplexer means are input to the phase shift network system means which comprises L/2 the phase shift networks, where j=1,2,...L/2. The two kinds of signals are made to have a 90-degree phase difference by the phase shift network system means.

The two kinds of outputs from the phase shift network system means are input to the first multiplying means which comprises L/2 pair of the multipliers.

In the first multiplying means, the two kinds of signals which have a 90-degree phase difference are multiplied by the two timing signals respectively which are different or identical as expressed by:

$$A(-1)^{(KL)/2+n}$$

and/or $$A(-1)^{((K-1)L)/2+n}$$

Meanwhile, in the second multiplying means, a constant B is multiplied by one of the timing signals.

One of the two kinds of outputs of the first multiplying means is input to the adding means which comprises L/2 adders for adding to the output of the second multiplying means.

The outputs of adding means are input to the multiplexer means.

The other of the two kinds of outputs of the first multiplying means is directly input to the multiplexer means.

The multiplexer means selects the outputs of the adding means and the other of the two kinds of outputs of the first multiplying means in accordance with the sampling period t.

More particularly, the demultiplexer means delivers x(1) through the 1st sequence, x(2) through the 2nd sequence, and ...... the L-th x(L) through the L-th sequence, (L+1)-th x(L+1) through the 1st sequence, ...... .

For example, the delivered digital signal in the 1st sequence is $x_1(t_1)$ as denoted by:

$$x_1(t_1)=\{x(1),x(L+1),x(2L+1),\ldots\ldots\}$$

The delivered digital signal in the 2nd sequence is $x_2(t_2)$ as denoted by:

$$x_2(t_2)=\{x(2),x(2L+2),\ldots\ldots\}$$

The two outputs $x_1(t_1)$ and $x_2(t_2)$ from the demultiplexer means are input to the 1st phase shift network. The two outputs $x_1(t_1)$ and $x_2(t_2)$ are made to have a 90-degree phase difference by the 1st phase shift network.

The two outputs $y_1$ and $y_2$ from the 1st phase shift network are input to the 1st pair of the multipliers. In the 1st pair of the multipliers, the two outputs $y_1$ and $y_2$ which have a 90-degree phase difference are multiplied by the timing signals respectively which are different or identical as expressed by:

$$A(-1)^{(KL)/2+1}$$

and/or $$A(-1)^{((K-1)L)/2+1}$$

Meanwhile, in the second multiplying means, a constant B is multiplied by one of the timing signals.

One of the outputs $z_1$ and $z_2$ of the 1st pair of the multipliers is added to the output of the second multiplying means in the 1st adder.

The output (eg. $z_2'$) of the 1st adder is input to the multiplexer means.

The other of the 1st pair of the multipliers is directly input to the multiplexer means.

The delivered digital signal in the (L−1)-th sequence is $x_{L-1}(t_{L-1})$ as denoted by:

$$x_{L-1}(t_{L-1})=\{x(L-1),x(2L-1),x(3L-1),\ldots\ldots\}$$

The delivered digital signal in the L-th sequence is $x_L(t_L)$ as denoted by:

$$x_L(t_L)=\{x(L),x(2L),x(3L),\ldots\ldots\}$$

The two outputs $x_{L-1}(t_{L-1})$ and $x_L(t_L)$ from the demultiplexer means are input to the L/2-th phase shift network to make a 90-degree phase difference between the two signals. The two outputs $y_{L-1}$ and $y_L$ from the L/2-th phase shift network are input to the L/2-th pair of the multipliers. In the L/2-th pair of the multipliers, the two outputs $y_{L-1}$ and $y_L$ which have a 90-degree phase difference are multiplied respective by the timing signals as expressed by:

$$A(-1)^{(KL)/2+(L-1)}$$

and/or $$A(-1)^{((K-1)L)/2+(L-1)}$$

Meanwhile, in the second multiplying means, a constant B is multiplied by one of the timing signals. One of the outputs $z_{L-1}$ and $z_L$ of the L/2-th pair of the multipliers is added to the output of the second multiplying means in the L/2-th adder.

The output (eg. $z_L'$) of the L/2-th adder is input to the multiplexer means.

The other of the L/2-th pair of the multipliers is directly input to the multiplexer means.

The output signals $z_1, z_2', \ldots, z_{L-1}$, and $z_L'$ from the L/2-th to the L/2-th pair of the multipliers are selected in accordance with the sampling period t.

In the forth above-noted SSB modulator, the demultiplexer means successively distributes the A/D converted digital signal $x(t)$ to L sequences $x_1(t_1), x_2(t_2) \ldots x_L(t_L)$ in accordance with a sampling period t, wherein $$x_1(t_1) = x(t) \quad t_1 = [(t-1)/L]$$
$$x_2(t_2) = x(t) \quad t_2 = [(t-2)/L]$$
$$\ldots$$
$$x_L(t_L) = x(t) \quad t_L = [(t-L)/L]$$

and [.] expresses a positive integer number.

L/2 sequences $x_i(t_i)$ are input to adding means which comprises L/2 adders for adding constants, wherein i is an even number or an odd number.

The outputs of the adding means are input to the phase shift network system means which comprises L/2 the phase shift networks.

The rest of L/2 sequences $x_i(t_i)$ are directly input to the phase shift network system means, wherein i is an odd number or an even number.

The two kinds of signals are made to have a 90-degree phase difference by the phase shift network system means.

The two kinds of outputs of the phase shift network system means are input to the control means which comprises L/2 pair of the control circuits.

In the control means, the signs of the two kinds of outputs of the phase shift network system means are controlled by the timing signals as expressed by:

$$\{1+(-1)^{(KL)/2+n}\}/2$$

and/or $$\{1+(-1)^{((K-1)L)/2+n}\}/2$$

More particularly, the control means controls the signs of input signals which invert when the timing signal is 1 and remain unchanged when it is 0.

The outputs of the control means are selected in accordance with the sampling period t.

More particularly, the demultiplexer means delivers $x(1)$ through the 1st sequence, $x(2)$ through the 2nd sequence, and ...... the L-th $x(L)$ through the L-th sequence, $(L+1)$-th $x(L+1)$ through the 1st sequence, $(L+2)$-th $x(L+2)$ through the 2nd sequence, ... .

For example, the delivered digital signal in the 1st sequence is $x_1(t_1)$ as denoted by:

$$x_1(t_1) = \{x(1), x(L+1), x(2L+1), \ldots \ldots\}$$

The delivered digital signal in the 2nd sequence is $x_2(t_2)$ as denoted by:

$$x_2(t_2) = \{x(2), x(L+2), x(2L+2), \ldots \ldots\}$$

The delivered digital signal in 2nd sequence $x_2(t_2)$ (or the delivered digital signal $x_1(t_1)$) from the demultiplexer means is input to the 1st adder for adding constant B.

The delivered digital signal in 1st sequence $x_1(t_1)$ (or the delivered digital signal $x_2(t_2)$) is directly input to the 1st phase shift network.

The two signals $x_1(t_1)$ and $x_2(t_2)$+B (or $x_1(t_1)$+B and $x_2(t_2)$) are made to have a 90-degree phase difference by the 1st phase shift network. The two outputs $y_1$ and $y_2$ of the 1st phase shift network are input to the 1st pair of the control circuits. In the 1st pair of the control circuits, the signs of the two kinds of outputs $y_1$ and $y_2$ from the 1st phase shift network invert when a timing signal is 1 and remain unchanged when it is 0. The timing signals are expressed by:

$$\{1+(-1)^{(KL)/2+1}\}/2$$

and/or $$\{1+(-1)^{((K-1)L)/2+1}\}/2$$

The outputs $z_1$ and $z_2$ of the 1st pair of the control circuits are input to the multiplexer means.

The delivered digital signal in the (L−1)-th sequence is $x_{L-1}(t_{L-1})$ as denoted by:

$$x_{L-1}(t_{L-1}) = \{x(L-1), x(2L-1), x(3L-1), \ldots \ldots\}$$

The delivered digital signal in the L-th sequence is $x_L(t_L)$ as denoted by:

$$x_L(t_L) = \}x(L)x(2L), x(3L), \ldots \ldots\}$$

The delivered digital signal in the L-th sequence $x_L(t_L)$ (or the delivered digital signal $x_{L-1}(t_{L-1})$ is input to the L/2-th adder for adding constant B.

The delivered digital signal in (L−1)-th sequence $x_{L-1}(t_{L-1})$ (or the delivered digital signal $x_L(t_L)$) is directly input to the L/2-th phase shift network.

The two kinds of signals $x_{L-1}(t_{L-1})$ and $x_L(t_L)$+B (or $x_{L-1}(t_{L-1})$+B and $x_L(t_L)$) are made to have a 90-degree phase difference by the L/2-th phase shift network.

The two outputs $y_{L-1}$ and $y_L$ from the L/2-th phase shift network are input to L/2-th pair of the control circuits.

In the L/2-th pair of the control circuits, the signs of the two kinds of outputs $y_{L-1}$ and $y_L$ from the L/2-th phase shift network invert when the timing signal is 1 and remain unchanged when it is 0.

The timing signals are expressed by:

$$\{1+(-1)^{(KL)/2+(L/2)}\}/2$$

and/or $$\{1+(-1)^{((K-1)L)/2+(L/2)}\}/2$$

The outputs $z_{L-1}$ and $z_L$ of the L/2-th pair of the control circuits are input to the multiplexer means. The output signals $z_1, z_2, \ldots, z_{L-1}$ and $z_L$ of the L/2-th to the L/2-th pair of the control circuits are selected in accordance with the sampling period t by multiplexer means.

In the fifth above-noted SSB modulator, the demultiplexer means successively distributes the A/D converted digital signal $x(t)$ to L sequences $x_1(t_1), x_2(t_2) \ldots x_L(t_L)$ in accordance with a sampling period t, wherein $$x_1(t_1) = x(t) \quad t_1 = [(t-1)/L]$$
$$x_2(t_2) = x(t) \quad t_2 = [(t-2)/L]$$
$$\ldots$$
$$x_L(t_L) = x(t) \quad t_L = [(t-L)/L]$$

and [.] expresses a positive integer number.

The two kinds of signals $x_{2j-1}(t_{2j-1})$ and $x_{2j}(t_{2j})$ from the demultiplexer means are input to the phase shift network system means which comprises L/2 the phase shift networks, where j=1,2, ... L/2.

The two kinds of signals are made to have a 90-degree phase difference by the phase shift network system means.

One of the two kinds of outputs from the phase shift network system means which have a 90-degree phase difference is input to the adding means which comprises L/2 adders for adding constants.

The outputs of the adding means are input to the control means which comprises L/2 pair of the control circuits.

The other of the two kinds of outputs from the phase shift network system means is directly input to the control means.

In the control means, the signs of the two kinds of outputs of the phase shift network system means are controlled by the timing signals as expressed by:

$$\{1+(-1)^{(KL)/2+n}\}/2$$

and/or $$\{1+(-1)^{((K-1)L)/2+n}\}/2$$

More particularly, the control means controls the signs of input signals which invert when the timing signal is 1 and remain unchanged when it is 0.

The outputs of the control means are selected by the multiplexer means in accordance with the sampling period t.

More particularly, the demultiplexer means delivers x(1) through the 1st sequence, x(2) through the 2nd sequence, and ... ... the L-th xL through the L-th sequence, (L+1)-th x(L+1) through the 1st sequence, ... ... .

For example, the delivered digital signal in the 1st sequence $x_1(t_1)$ as denoted by:

$$x_1(t_1)=\{x(1),x(L+1), x(2L+1),... ...\}$$

The delivered digital signal in the 2nd sequence is $x_2(t_2)$ as denoted by:

$$x_2(t_2)=\{x(2),x(L+2),x(2L+2),... ...\}$$

The two outputs $x_1(t_1)$ and $x_2(t_2)$ from the demultiplexer means are input to the 1st phase shift network to make a 90-degree phase difference between the two signals.

One of the two outputs $y_1$ and $y_2$ from the 1st phase shift network is input to the 1st adder, the output of the 1st adder and the other of the two outputs $y_1$ and $y_2$ are input to the 1st pair of the control circuits for controlling the signs of the other of the outputs $y_1$ and $y_2$ of the 1st phase shift network and the outputs of the 1st adder in accordance with the two timing signals respectively which are different or identical as expressed by:

$$\{1+(-1)^{(KL)/2+1}\}/2$$

and/or $$\{1+(-1)^{((K-1)L)/2+1}\}/2$$

The outputs $z_1$ and $z_2$ of the 1st pair of the control circuits are input to the multiplexer means.

The delivered digital signal in the (L−1)-th sequence is $x_{L-1}(t_{L-1})$ as denoted by:

$$x_{L-1}(t_{L-1})=\{x(L-1),x(2L-1),x(3L-1),... ...\}$$

The delivered digital signal in the L-th sequence is $x_L(t_L)$ as denoted by:

$$x_L(t_L)=\{x(L),x(2L),x(3L),... ...\}$$

The two outputs $x_{L-1}(t_{L-1})$ and $x_L(t_L)$ from the demultiplexer means are input to the L/2-th phase shift network to make a 90-degree phase difference between the two signals.

One of the two outputs $y_{L-1}$ and $y_L$ from the L/2-th phase shift network is input to the L/2-th adder, the output of the L/2-th adder and the other of the two outputs $y_{L-1}$ and $y_L$ are input to the L/2-th pair of the control circuits for controlling the signs of the other of the outputs $y_{L-1}$ and $y_L$ of the L/2-th phase shift network and the outputs of the L/2-th adder in accordance with the two timing signals respectively which are different or identical as expressed by:

$$\{1+(-1)^{(KL)/2+(L/2)}\}/2$$

and/or $$\{1+(-1)^{((K-1)L)/2+(L/2)}\}/2$$

The outputs $z_{L-1}$ and $z_L$ of the L/2-th pair of the control circuits are input to the multiplexer means.

The outputs $z_1, z_2, ..., z_{L-1}$ and $z_L$ of the L/2-th to the L/2-th pair of the control circuits are selected by the multiplexer means in accordance with the sampling period t.

In the sixth above-noted SSB modulator, the demultiplexer means successively distributing the A/D converted digital signal x(t) to L sequences $x_1(t_1), x_2(t_2)... ...x_L(t_L)$ in accordance with a sampling period t, wherein $$x_1(t_1) = x(t) \quad t_1 = [(t-1)/L]$$
$$x_2(t_2) = x(t) \quad t_2 = [(t-2)/L]$$
$$...$$
$$x_L(t_L) = x(t) \quad t_L = [(t-L)/L]$$

and [.] expresses a positive integer number.

The two kinds of signals $x_{2j-1}(t_{2j-1})$ and $x_{2j}(t_{2j})$ from the demultiplexer means are input to the phase shift network system means which comprises L/2 the phase shift networks, where j=1,2,... L/2. The two kinds of signals are made to have a 90-degree phase difference by the phase shift network system means.

The two kinds of outputs from the phase shift network system means are input to the multiplying means which comprises L/2 pair of the multipliers.

In the multiplying means, the two kinds of signals which have a 90-degree phase difference are multiplied by the two timing signals respectively which are different or identical as expressed by:

$$A(-1)^{(KL)/2+n}$$

and/or $$A(-1)^{((K-1)L)/2+n}$$

One of the two kinds of outputs of the multiplying means is input to the adding means which comprises L/2 adders for adding to one of the outputs of the timing signal generating means.

The outputs of adding means are input to the multiplexer means.

The other of the two kinds of outputs of the multiplying means is directly input to the multiplexer means.

The multiplexer means selects the outputs of the adding means and the other of the two kinds of outputs of the multiplying means in accordance with the sampling period t.

More particularly, the demultiplexer means delivers x(1) through the 1st sequence, x(2) through the 2nd sequence, and ... the L-th x(L) through the L-th sequence, (L+1)-th x(L+1) through the 1st sequence, ... ... .

For example, the delivered digital signal in the 1st sequence is $x_1(t_1)$ as denoted by:

$$x_1(t_1)=\{x(1),x(L+1),x(2L+1),... ...\}$$

The delivered digital signal in the 2nd sequence is $x_2(t_2)$ as denoted by:

$$x_2(t_2) = \{x(2), x(L+2), x(2L+2), \ldots \ldots\}$$

The two outputs $x_1(t_1)$ and $x_2(t_2)$ from the demultiplexer means are input to the 1st phase shift network to make a 90-degree phase difference between the two signals.

The two outputs $y_1$ and $y_2$ of the 1st phase shift network are input to the 1st pair of the multipliers for multiplying the two timing signals respectively expressed by:

$$A(-1)^{(KL)/2+1}$$

and/or $$A(-1)^{((K-1)L)/2+1}$$

One of the outputs $z_1$ and $z_2$ of the 1st pair of the multipliers is added to the one of the two timing signals in the 1st adder.

The output (eg. $z_2'$) of the 1st adder is input to the multiplexer means.

The other of the 1st pair of the multipliers is directly input to the multiplexer means.

The delivered digital signal in the (L−1)-th sequence is $x_{L-1}(t_{L-1})$ as denoted by:

$$x_{L-1}(t_{L-1}) = \{x(L-1), x(2L-1), x(3L-1), \ldots \ldots\}$$

The delivered digital signal in the L-th sequence is $x_L(t_L)$ as denoted by:

$$x_L(t_L) = \{x(L), x(2L), x(3L), \ldots \ldots\}$$

The two outputs $x_{L-1}(t_{L-1})$ and $x_L(t_L)$ from the demultiplexer means are input to the L/2-th phase shift network to make a 90-degree phase difference between the two signals.

The two outputs $y_{L-1}$ and $y_L$ of the L/2-th phase shift network are input to the L/2-th pair of the multipliers for multiplying the two timing signals respectively expressed by:

$$A(-1)^{(KL)/2+(L-1)}$$

and/or $$A(-1)^{((K-1)L)/2+(L-1)}$$

One of the outputs $z_{L-1}$ and $z_L$ of the L/2-th pair of multipliers is added to the one of the two timing signals in the L/2-th adder.

The output (eg. $z_L'$) of the L/2-th adder is input to the multiplexer means.

The other output of L/2-th pair of the multipliers is directly input to the multiplexer means.

The output signals $z_1, z_2', \ldots, z_L'$ from the 1st to the L/2-th pair of the multipliers and the 1st to L/2-th adders are selected in accordance with the sampling period t.

In the seventh above-noted SSB modulator, the demultiplexer means successively distributing the A/D covered digital signal $x(t)$ to L sequences $x_1(t_1), x_2(t_2)\ldots \ldots x_L(t_L)$ in accordance with a sampling period t, wherein $$x_1(t_1) = x(t) \quad t_1 = [(t-1)/L]$$
$$x_2(t_2) = x(t) \quad t_2 = [(t-2)/L]$$
$$\ldots$$
$$x_L(t_L) = x(t) \quad t_L = [(t-L)/L]$$

and [.] expresses a positive integer number.

The two kinds of signals $x_{2j-1}(t_{2j-1})$ and $x_{2j}(t_{2j})$ from the demultiplexer means are input to the phase shift network system means which comprises L/2 the phase shift networks, where $j = 1, 2, \ldots \ldots L/2$.

The two kinds of signals are made to have a 90-degree phase difference by the phase shift network system means.

The two kinds of outputs from the phase shift network system means are input to the multiplying means which comprises L/2 pair of the multipliers.

In the multiplying means, the two kinds of signals which have a 90-degree phase difference are multiplied by the two timing signals respectively which are different or identical as expressed by:

$$A(-1)^{(KL)/2+n}$$

and/or $$A(-1)^{((K-1)L)/2+n}$$

Meanwhile, one of the two timing signals is bit shifted in the bit shift means.

One of two kinds of outputs of the multiplying means is input to the adding means which comprises L/2 adders for adding to the output of the shift means.

The outputs of adding means are input to the multiplexer means.

The other of the two kinds of output of the multiplying means is directly input to the multiplexer means.

The multiplexer means selects the outputs of the adding means and the other of the two kinds of outputs of the multiplying means in accordance with the sampling period t.

More particularly, the demultiplexer means delivers $x(1)$ through the 1st sequence, $x(2)$ through the 2nd sequence, and … the L-th $x(L)$ through the L-th sequence, (L+1)-th $x(L+1)$ through the 1st sequence, For example, the delivered digital signal in the 1st sequence is $x_1(t_1)$ as denoted by:

$$x_1(t_1) = \{x(1), x(L+1), x(2L+1) \ldots \ldots\}$$

The delivered digital signal in the 2nd sequence is $x_2(t_2)$ as denoted by:

$$x_2(t_2) = \{x(2), x(L+2), x(2L+2) \ldots \ldots\}$$

The two outputs $x_1(t_1)$ and $x_2(t_2)$ from the demultiplexer means are input to the 1st phase shift network to make a 90-degree phase difference between the two signals.

The two outputs $y_1$ and $y_2$ of the 1st phase shift network are input to the 1st pair of the multipliers for multiplying the two timing signals respectively expressed by:

$$A(-1)^{(KL)/2+1}$$

and/or $$A(-1)^{((K-1)L)/2+1}$$

Meanwhile, one of the two timing signals is bit shifted in the bit shift means.

One of the outputs $z_1$ and $z_2$ of the 1st pair of the multipliers is input to 1st adder for adding the output of the bit shift means.

The output (eg. $z_2'$) of the 1st adder is input to the multiplexer means.

The other of the outputs $z_1$ and $z_2$ the 1st pair of the multipliers is directly input to the multiplexer means.

The delivered digital signal in the (L–1)-th sequence is $x_{L-1}$) as denoted by:

$$x_{L-1}(t_{L-1}) = \{x(L-1), x(3L-1), \ldots \ldots\}$$

The delivered digital signal in the L-th sequence is $x_L$ ($t_L$) as denoted by:

$$X_L(t_L) = \{x(L), x(2L), x(3L), \ldots \ldots\}$$

The two outputs $x_{L-1}$ ($t_{L-1}$) and $x_L$ ($t_L$) from the demultiplexer means are input to the L2-th phase shift network to make a 90-degree phase difference between the two signals.

The two outputs $y_{L-1}$ and $y_L$ of the L/2-th phase shift network are input to the L/2-th pair of the multipliers for multiplying the two timing signals respectively expressed by:

$$A(-1)^{(KL)/2+(L-1)}$$

and/or $$A(-1)^{((K-1)L)/2+(L-1)}$$

Meanwhile, one of the two timing signals is bit shifted in the bit shift means. One of the outputs $z_{L-1}$ and $z_L$ of the L/2-th pair of the multipliers is input to the L/2-th adder for adding the output of the bit shift means.

The output (eg. $z_L'$) of the L/2-th adder is input to the multiplexer means.

The other of the outputs $z_{L-1}$ and $z_L$ of the L/2-th pair of the multipliers is directly input to the multiplexer means.

The output signals $z_1$, $z_2'$,... ..., $z_{L-1}$, and $z_L'$ from the L/2-th to the L/2-th pair of the multipliers and the L/2-th to the L/2-th adders are selected in accordance with the sampling period t.

DETAILED DESCRIPTION OF THE PREFERRED EMBODIMENT

Preferred embodiment of the present invention are described below referring to the accompanying drawings.

Embodiment 1

Figure 1:
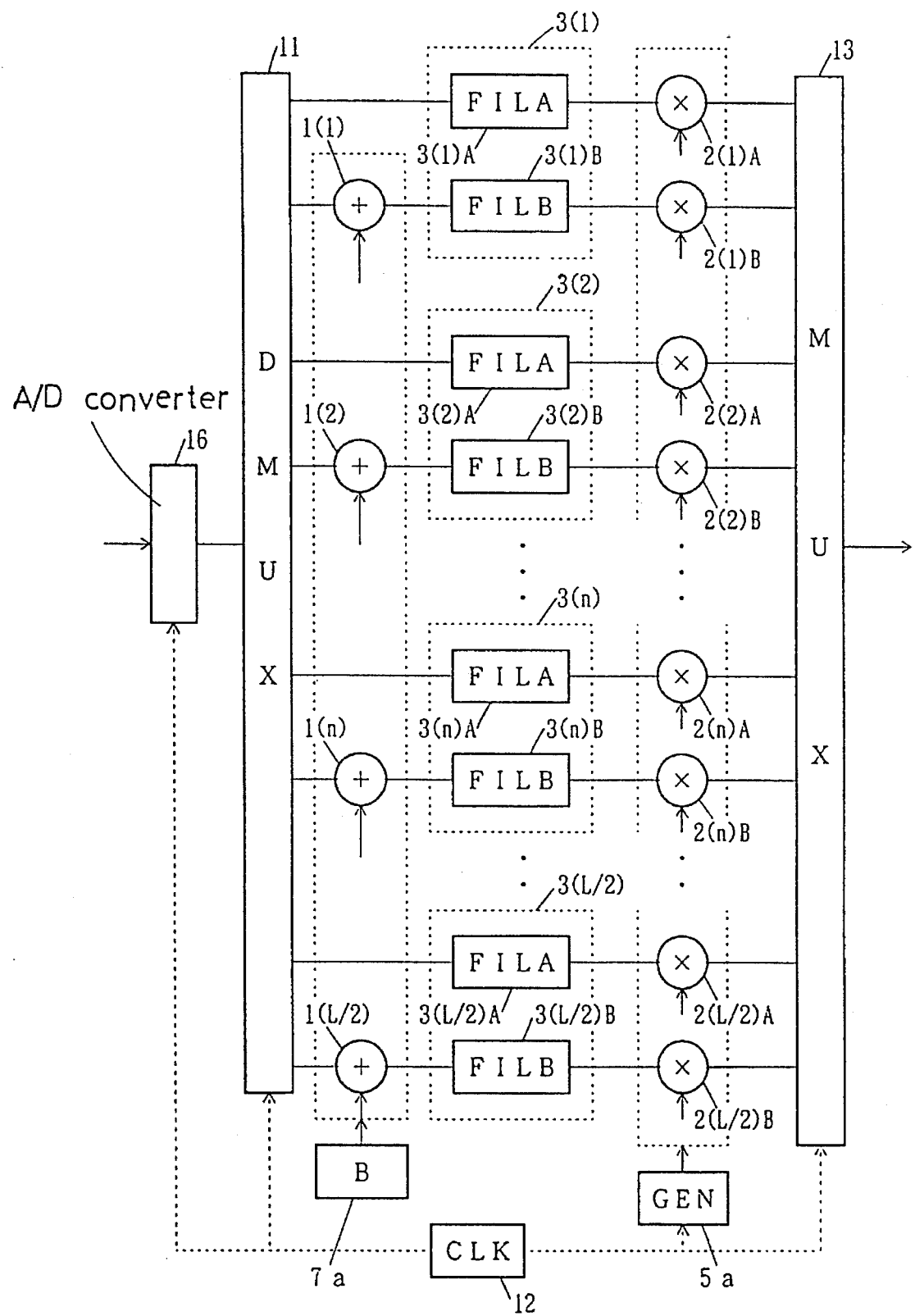
FIG. 1 is a block diagram of an SSB modulator in accordance with an embodiment of the present invention.
Figure 2:
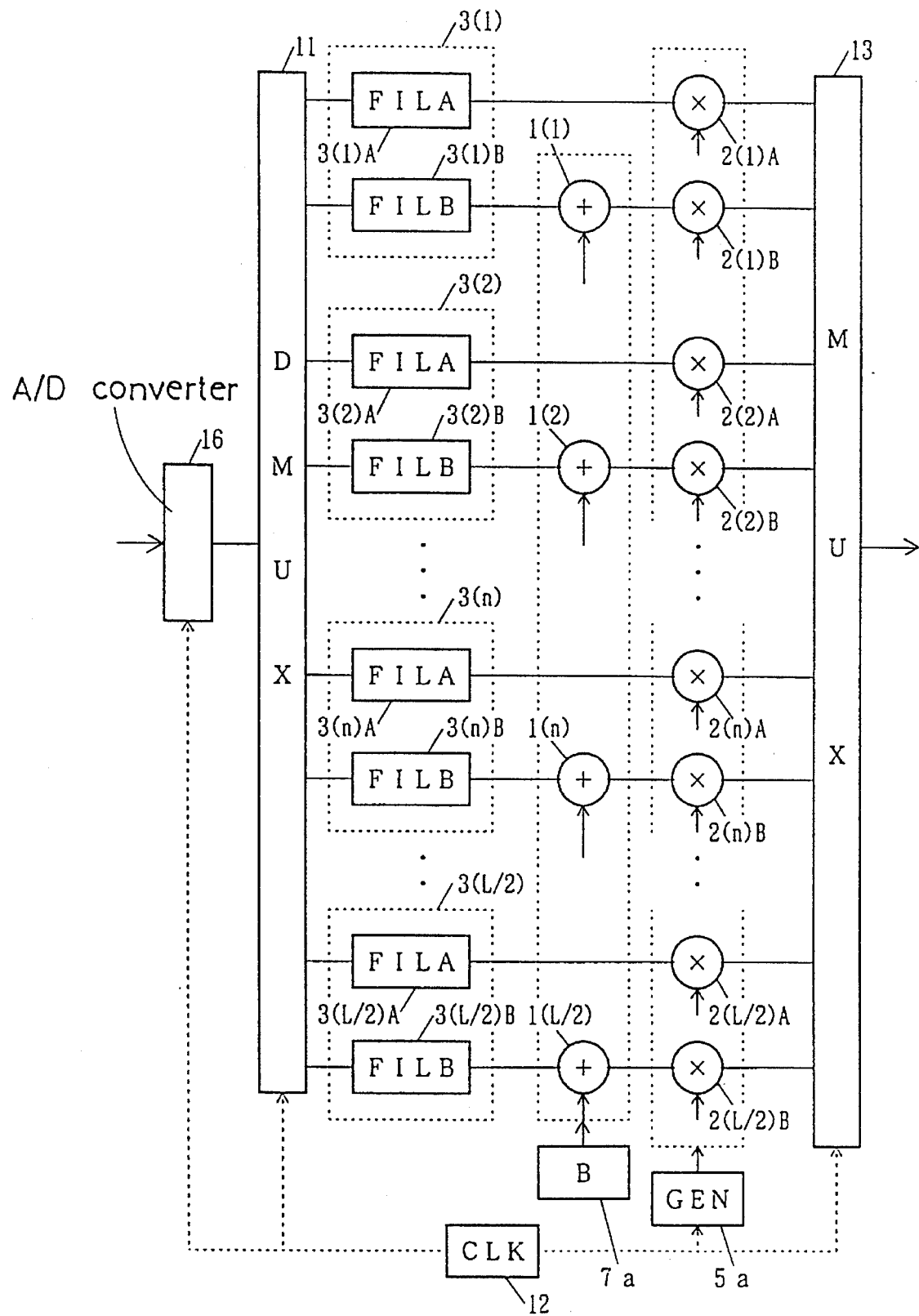
FIG. 2 is a block diagram of an SSB modulator in accordance with another embodiment of the present invention.
Figure 3:
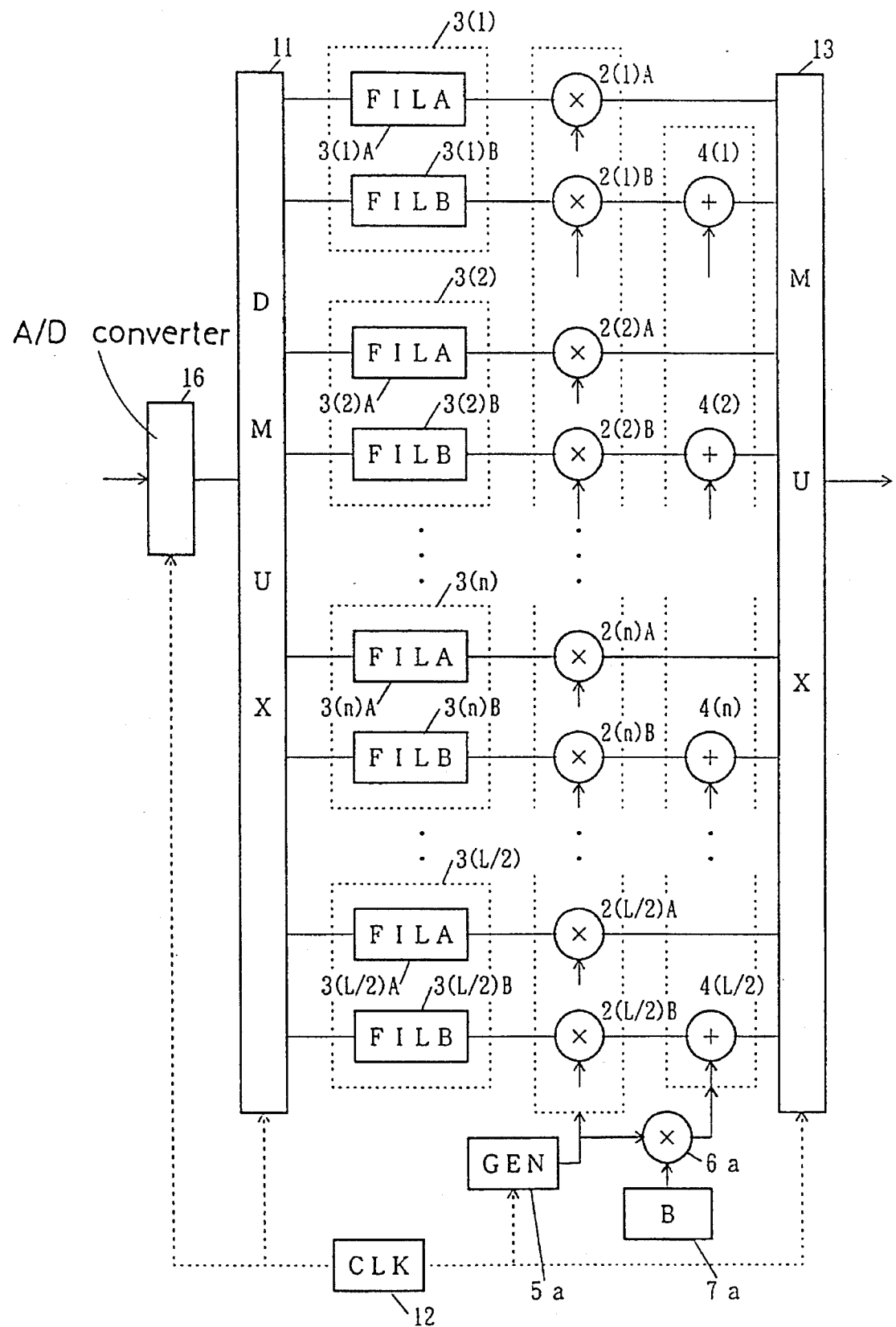
FIG. 3 is a block diagram of an SSB modulator in accordance with another embodiment of the present invention.
Figure 4:
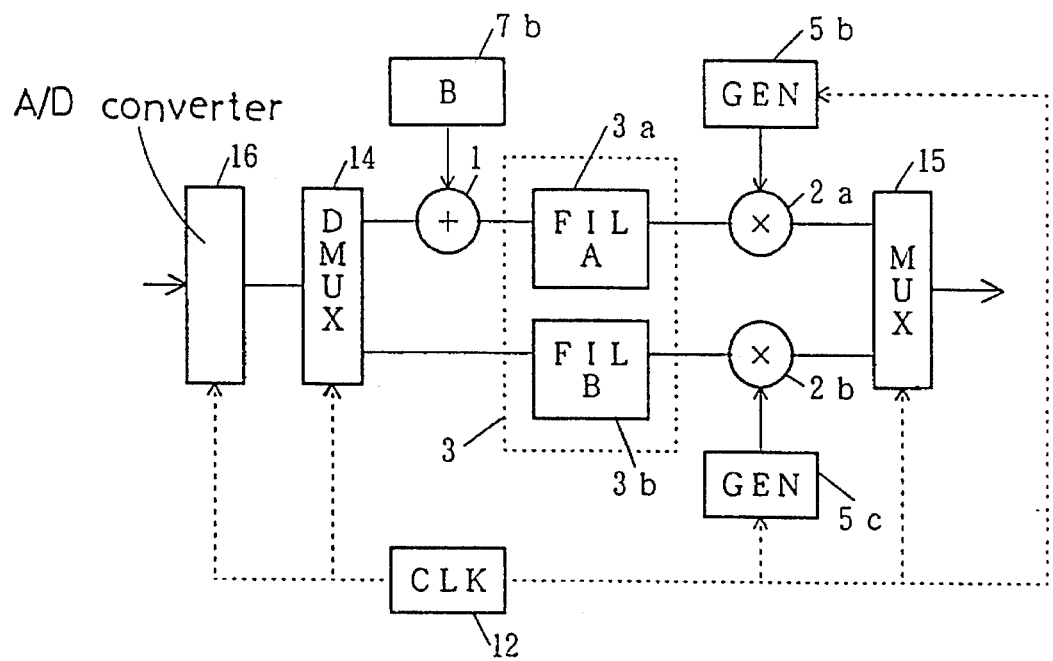
FIG. 4 is a block diagram of an SSB modulator according to the first embodiment of the present invention.

FIG. 4 is a block diagram of an SSB modulator according to the first embodiment of the present invention, in which only one phase shift network (L=2, n=1) is provided in the simplest circuit arrangement.

As shown, there is also provided an A/D converter 16 for converting an analog signal to a digital signal, a demultiplexer 14 (referred to as DMUX hereinafter) for delivering the converted digital signal x(t) through two sequences $x_1$ ($t_1$), $x_2$ ($t_2$) in accordance with a sampling period t, wherein $$x_1(t_1) = x(t) \quad t_1 = [(t-1)/L]$$
$$x_2(t_2) = x(t) \quad t_2 = [(t-2)/L]$$

and [.] expresses a positive integer number, a constant generator 7b for generating constant B, an adder 1 for adding constant B to $x_1$ ($t_1$) from DUMX 14, a phase shift network 3 comprising two all-pass filters 3a and 3b (referred to as FILs hereinafter) for making a 90-degree phase difference between the output of the adder 1 and $x_2$ ($t_2$) from DUMX 14, two timing signal generators 5b and 5c for generating timing signals expressed by A $(-1)^{(KL)/2+n}$ and/or A $(-1)^{((K-1)L)/2+n}$, a pair of multipliers 2a and 2b for multiplying the outputs of the phase shift network 3 by the timing signals of the timing signal generators 5b and 5c respectively, and a multiplexer 15 (referred to as MUX hereinafter) for selecting the outputs of the pair of the multipliers 2a and 2c in accordance with the sampling period t.

The constant generator 7b selects one value from a plurality of predetermined values in a memory and supplies it as constant B to the adder 1.

An analog input signal is converted to a digital signal x(t) at the sampling frequency fs by the A/D converter 16.

The obtained digital signal x(t) is input to DMUX 14.

The digital signal x(t) is expressed by:

$$x(t) = \{x(1), x(2), x(3), x(4), x(5), \ldots \ldots\}$$

where t represents the sampling period.

The digital signal x(t) is delivered through two (L=2) sequences in accordance with the sampling period t.

One of the two delivered signals $x_1$ ($t_1$) and $x_2$ ($t_2$) is added to constant B by the adder 1 and the output of the adder 1 is input to the phase shift network 3.

The other of the two delivered signals $x_1$ ($t_1$) and $x_2$ ($t_2$) is directly input to the phase shift network 3.

More particularly, DMUX 14 delivering x(1) through the 1st sequence, x(2) through the 2nd sequence, x(3) through the 1st sequence, x(4) through the 2nd sequence, and ... ..., the (L–1)-Th x(L–1) through the 1st sequence, L- th x(L) through the 2nd sequence, ... ... .

The delivered digital signal $x_1$ ($t_1$) in the 1st sequence is expressed by:

$$x_1(t_1) = \{x(1), x(3), x(5), \ldots x(L-1), \ldots \ldots\}$$

The delivered digital signal $x_2(t_2)$ in the 2nd sequence is expressed by:

$$x_2(t_2) = \{x(2), x(4), x(6), \ldots x(L), \ldots \ldots\}$$

The delivered signal $x_1(t_1)$ is input to the adder 1, the output $x_1'(t_1)$ of the adder 1 and the delivered signal $x_2(t_2)$ are input to the FILs 3a and 3b in the phase shift network 3 to make a 90-degree phase difference between the two signals.

The two signals $x_1'(t_1)$ and $x_2(t_2)$ is expressed by:

$$x_1'(t_1) = \{x(1)+B, x(3)+B, x(5)+B, \ldots x(L-1)+B \ldots \ldots\}$$

$$x_2(t_2) = \{x(2), x(4), x(6), \ldots x(L) \ldots \ldots\}$$

The frequency of the two signals $x_1'(t_1)$ and $x_2(t_2)$ is ½ of the sampling frequency fs. The two outputs $y_1$ and $y_2$ of the FILs 3a and 3b are input to the pair of multipliers for multiplying (modulating) the two timing signals from the timing signal generators 5b and 5c.

The output signals $z_1$ and $z_2$ from the pair of the multipliers 2a and 2b are selected to produce a digital modulated SSB signal in accordance with the sampling period t by MUX 15.

As a result, the suppressed carrier SSB signal or the low carrier SSB signal can be obtained.

The multiplication (modulation) will be explained in more detail.

It is assumed for the first embodiment that L=2 as the phase shift network 3 is a single unit, n=1 and, A=1 with the above statements (1) and (2).

Accordingly, either the timing signal generators 5b or 5c generate timing signal expressed by:

$$(-1)^{K+1} \text{ or } (-1)^K.$$

If the analog input signal is a [C·cos ωt], and is sampled by sampling frequency fs.

The obtained digital signal x(t) is expressed by: $\{C \cdot \cos \omega t\}$

The digital signal x(t) is delivered through 2 (L=2) sequences in accordance with the sampling period t by DMUX 14.

The delivered digital signal $x_1(t_1)$ in the 1st sequence is expressed by:

$$x_1(t_1) = \{C \cdot \cos \omega 3, C \cdot \cos \omega 5, \ldots \ldots\}$$

The delivered digital signal $x_2(t_2)$ in the 2nd sequence is expressed by:

$$x_2(t_2) = \{C \cdot \cos \omega 2, C \cdot \cos \omega 4, C \cdot \cos \omega 6, \ldots \ldots\}$$

The delivered signal $x_1(t_1)$ is added to constant B by the adder 1 and the output $x_1'(t_1)$ of the adder 1 is input to the FIL 3a in the phase shift network 3.

The output $x_1'(t_1)$ of the adder 1 is expressed by:

$$x_1'(t_1) = \{C \cdot \cos \omega 1 + B, C \cdot \cos \omega 3 + B, C \cdot \cos \omega 5 + B, \ldots \ldots\}$$

The signal $x_2(t_2)$ is directly input to the FIL 3b in the phase shift network 3.

The two signals $x_1'(t_1)$ and $x_2(t_2)$ are input to the FILs 3a and 3b.

The outputs $y_1$ and $y_2$ of the FILs 3a and 3b are expressed by:

$$\begin{aligned} y_1 &= \{C \cdot \cos(\omega 1 + \theta) + B, C \cdot \cos(\omega 3 + \theta) + \\ &\quad B, C \cdot \cos(\omega 5 + \theta) + B, \ldots\} \\ y_2 &= \{C \cdot \cos(\omega 2 + \theta + \pi/2), C \cdot \cos(\omega 4 + \theta + \pi/2), \\ &\quad C \cdot \cos(\omega 6 + \theta + \pi/2), \ldots\} \\ &= \{-C \cdot \sin(\omega 2 + \theta), -C \cdot \sin(\omega 4 + \theta), - \\ &\quad C \cdot \sin(\omega 6 + \theta), \ldots\} \end{aligned}$$

The obtained signals $y_1$ and $y_2$ are multiplied by the timing signals from the timing signal generators 5b and 5c. If the two timing signals are identical, an USB signal can be obtained.

For example, the timing signals are identical as denoted by:

$$(-1)^{K+1} = \{1, -1, 1, -1, \ldots \ldots\}$$

The two outputs $z_{u1}$ and $z_{u2}$ of the multipliers 2a and 2b are expressed by:

$$\begin{aligned} z_{u1} &= \{C \cdot \cos(\omega t + \theta) + B\} \times (-1)^{K+1} \\ &= \{[C \cdot \cos(\omega 1 + \theta) + B], -[C \cdot \cos(\omega 3 + \theta) + \\ &\quad B], [C \cdot \cos(\omega 5 + \theta) + B], \ldots\} \\ z_{u2} &= \{-C \cdot \sin(\omega t + \theta)\} \times (-1)^{K+1} \\ &= \{-[C \cdot \sin(\omega 2 + \theta)], [C \cdot \sin(\omega 4 + \theta)], - \\ &\quad [C \cdot \sin(\omega 6 + \theta)], \ldots\} \end{aligned}$$

The two outputs $z_{u1}$ and $z_{u2}$ of the multipliers 2a and 2b are selected to produce digital modulated USB signal $z_u$ by MUX 15.

The digital USB signal $z_u$ is expressed by:

$$z_u = \{[C \cdot \cos(\omega 1 + \theta) + B], -[C \cdot \sin(\omega 2 + \theta)], -[C \cdot \cos(\omega 3 + \theta) + B], [C \cdot \sin(\omega 4 + \theta)], [C \cdot \cos(\omega 5 + \theta) + B], -[C \cdot \sin(\omega 6 + \theta)], \ldots \ldots\}$$

The digital USB signal $z_u$ is converted to an analog USB signal as denoted by:

$$z_u = B \cdot \sin \omega_c t + C \cdot \sin(\omega t + \theta + \omega_c t)$$

As apparent, B·sin ω ct represents the carrier and C·sin (ωt+θ+$\omega_c$ t) represents the USB signal, where $\omega_c$ is angular frequency of the carrier (having a frequency fc which is equal to ¼ of sampling frequency fs).

The obtained modulated signal is a suppressed carrier USB signal when B=0, a low carrier USB signal when 0<B<C, a full carrier USB signal when B=C.

Similarly, when the timing signals are identical as denoted by:

$$(-1)^k = \{-1, 1, -1, 1 \ldots \ldots\}$$

such an USB signal will be obtained.

When the timing signals are not identical or opposite to each other, an LSB signal will be obtained.

More particularly, for example, the timing signals are not identical as denoted by:

$$(-1)^{k+1} = \{1, -1, 1, -1 \ldots \ldots\}$$

and $$(-1)^k = \{-1, 1, -1, 1 \ldots \ldots\}$$

The two outputs $z_{l1}$ and $z_{l2}$ of the multipliers 2a and 2b are expressed by:

$$z_{l1} = \{C \cdot \cos(\omega t + \theta) + B\} \times (-1)^{K+1}$$
$$= \{[C \cdot \cos(\omega 1 + \theta) + B], -[C \cdot \cos(\omega 3 + \theta) + B], [C \cdot \cos(\omega 5 + \theta) + B], \ldots\}$$

$$z_{l2} = \{-C \cdot \sin(\omega t + \theta)\} \times (-1)^{K}$$
$$= \{[C \cdot \sin(\omega 2 + \theta)], -[C \cdot \sin(\omega 4 + \theta)], [C \cdot \sin(\omega 6 + \theta)], \ldots\}$$

The two outputs $z_{l1}$ and $z_{l2}$ of the multipliers 2a and 2b are selected to produce digital modulated LSB signal $z_l$ by MUX 15.

The digital LSB signal $z_l$ is expressed by:

$$z_l = \{[C \cdot \cos(\omega 1 + \theta) + B], [C \cdot \sin(\omega 2 + \theta)], -[C \cdot \cos(\omega 3 + \theta) + B], -[C \cdot \sin(\omega 4 + \theta)], [C \cdot \cos(\omega 5 + \theta) + B], [C \cdot \sin(\omega 6 + \theta)] \ldots \ldots\}$$

The LSB signal $z_l$ is converted to an analog LSB signal as denoted by:

$$z_l = B \cdot \sin \omega_c t + C \cdot \sin(\omega t + \theta - \omega_c t)$$

As apparent, $B \cdot \sin \omega_c t$ represents the carrier and $C \cdot \sin(\omega t + \theta - \omega_c t)$ represents the LSB signal.

The obtained modulated signal is a suppressed carrier LSB signal when B=0, a low carrier LSB signal when 0<B<C, a full carrier LSB signal when B=C.

In one embodiment of the SSB modulator defined, constants are added to the outputs of the phase shift network. However, the effect of such an SSB modulator is identical with the effect of the SSB modulator discussion above and will not be explained in more detail.

Embodiment 2

In the embodiment 2, only one phase shift network unit (L=2) is provided in the SSB modulator. A discussion any operation or function which is identical to that of the embodiment 1 will not be repeated.

Figure 5:
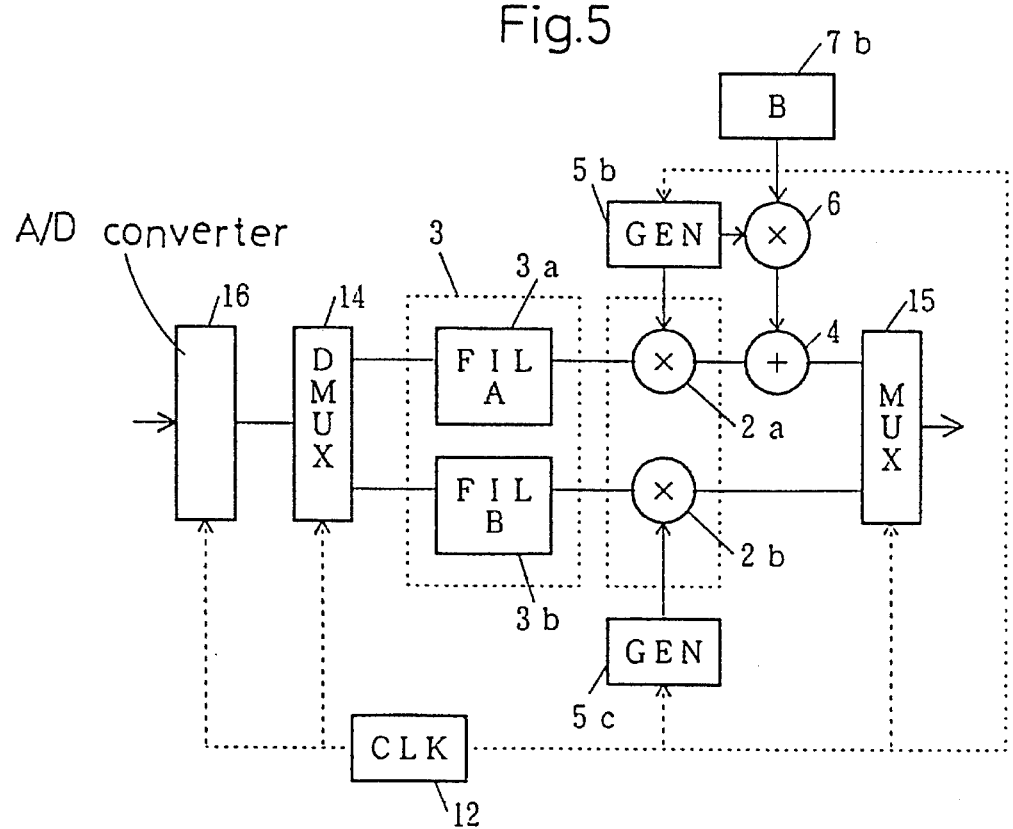
FIG. 5 is a block diagram of an SSB modulator according to the second embodiment of the present invention.
Figure 6:
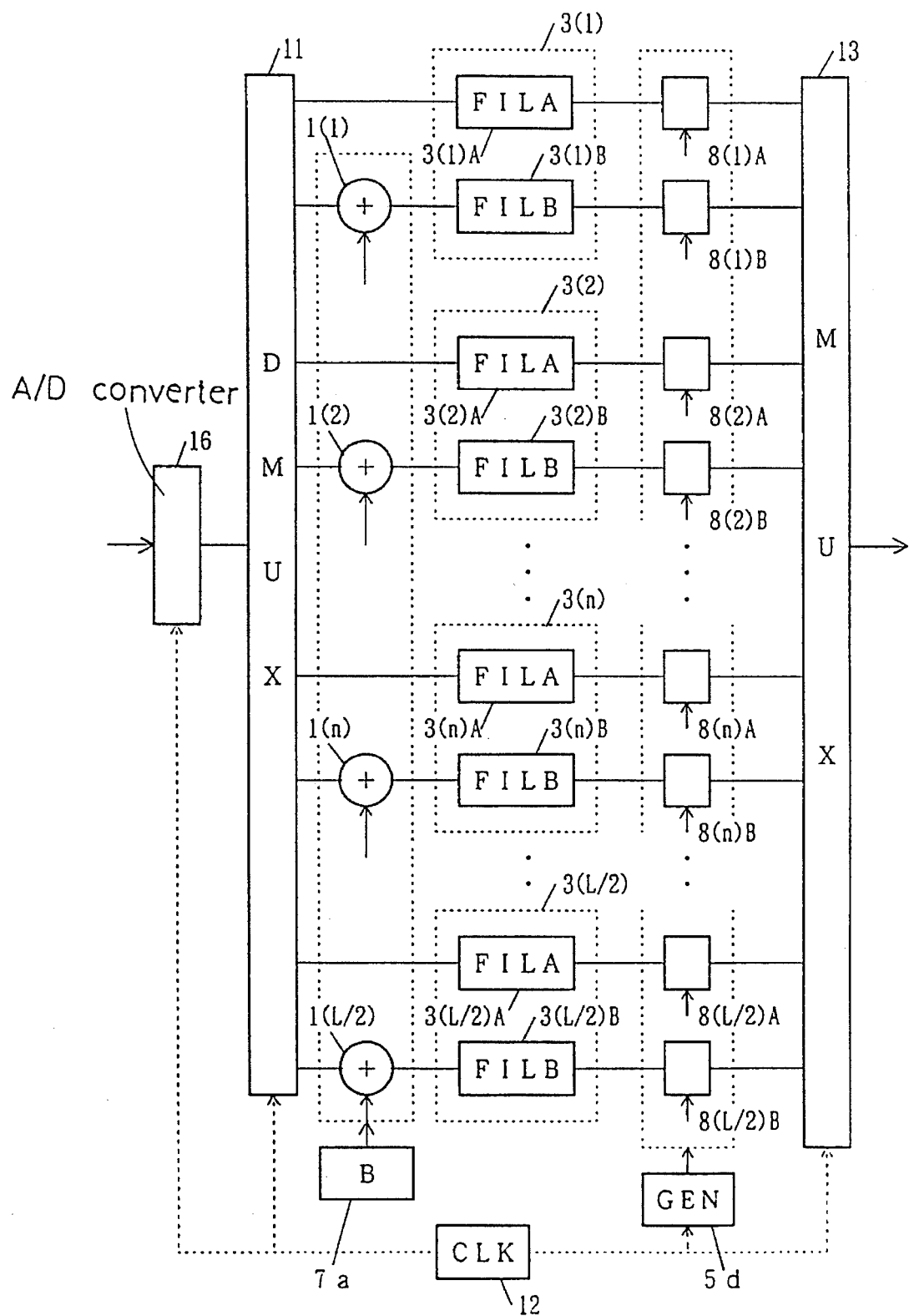
FIG. 6 is a block diagram of an SSB modulator in accordance with another embodiment of the present invention.
Figure 7:
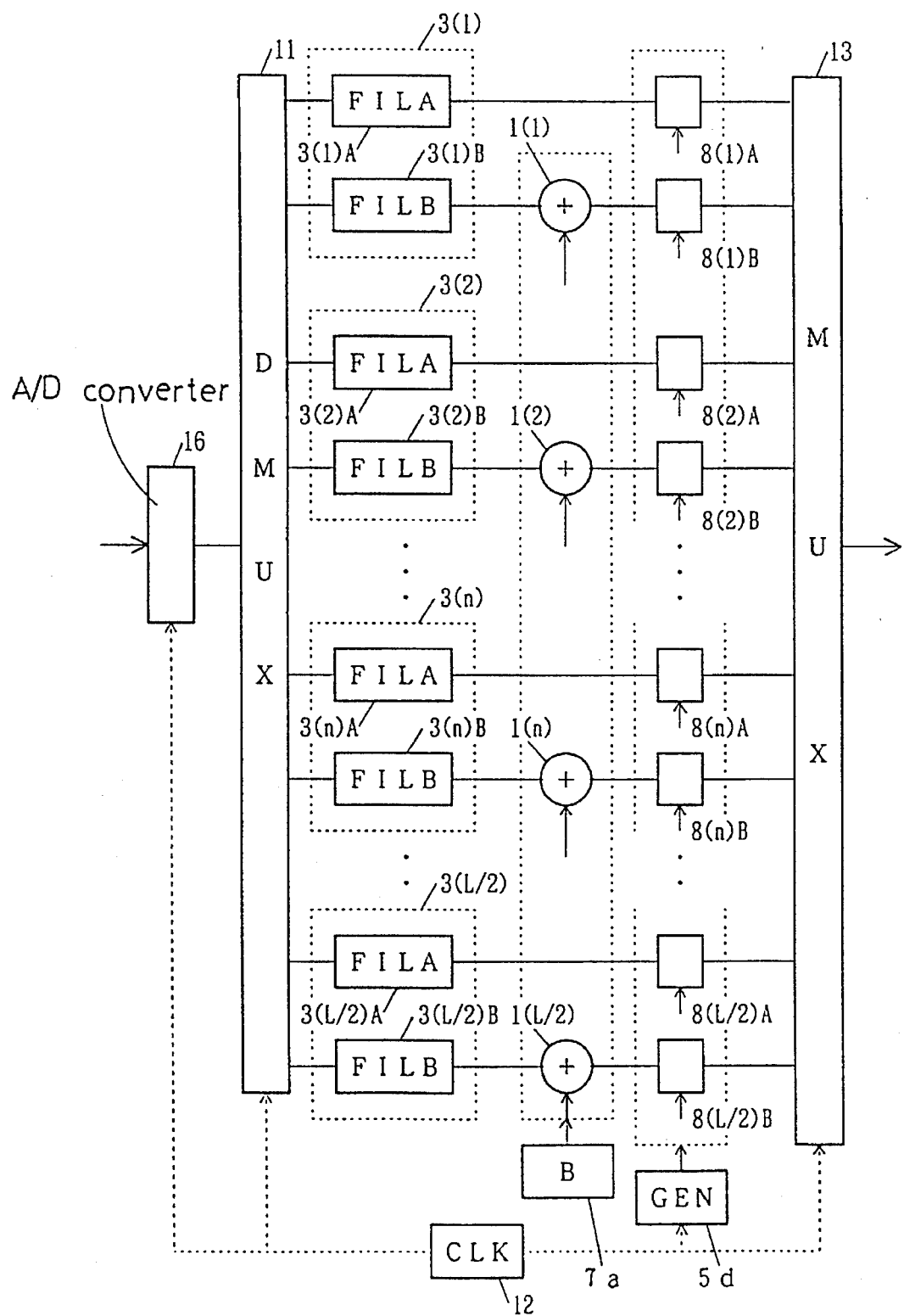
FIG. 7 is a block diagram of an SSB modulator in accordance with another embodiment of the present invention.
Figure 9:
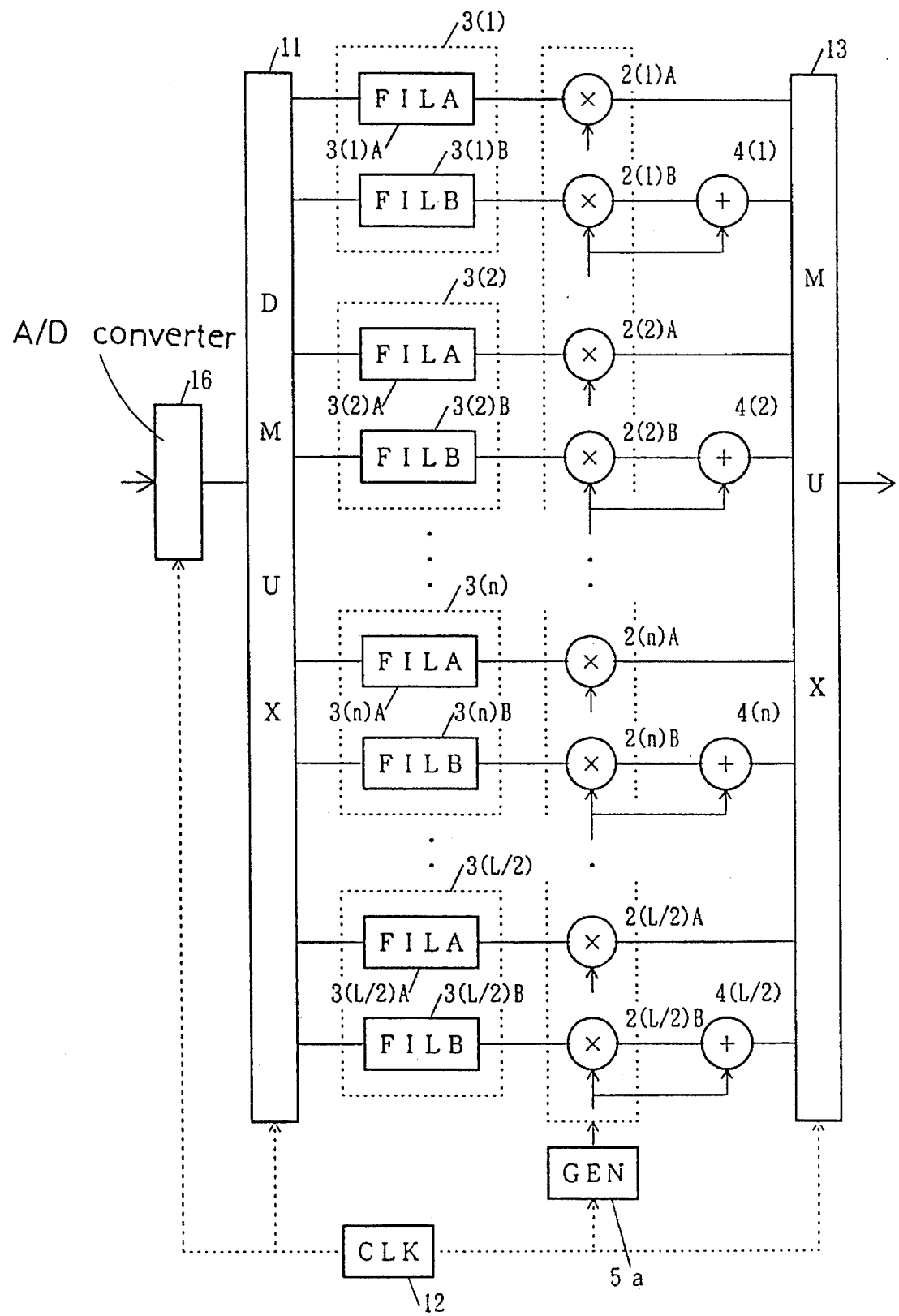
FIG. 9 is a block diagram of an SSB modulator in accordance with another embodiment of the present invention.
Figure 10:
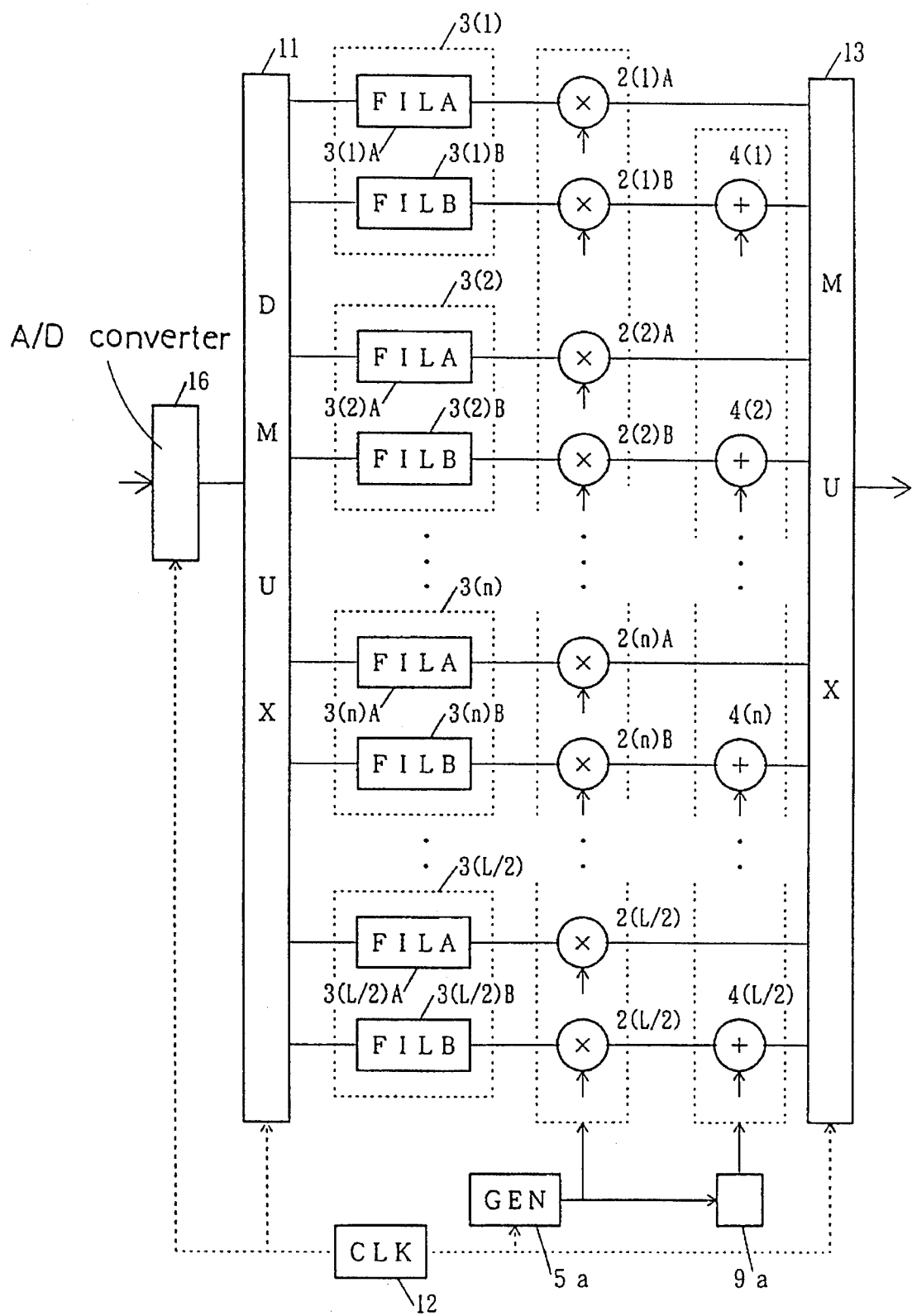
FIG. 10 is a block diagram of an SSB modulator in accordance with another embodiment of the present invention.

As shown in FIG. 5, there are also provided two timing signal generators 5b and 5c for generating timing signals expressed by $A(-1)^{(KL)/2+n}$ and/or $A(-1)^{((K-1)L)/2+n}$, a pair of multipliers 2a and 2b for multiplying the outputs of the FILs 3a and 3b of the phase shift network 3 by the timing signals of the timing signal generators 5b and 5c respectively, a constant generator 7b for generating constant B, a multiplier 6 for multiplying constant B by the timing signal from the timing signal generator 5b, an adder 4 for adding the output of the multipliers 2a to the output of the multiplier 6.

The A/D converted digital signal x(t) is delivered to the 2 sequences $x_1(t_1)$ and $x_2(t_2)$ in accordance with the sampling period t.

The two outputs $x_1(t_1)$ and $x_2(t_2)$ are input to the FILs 3a and 3b to make a 90- degree phase difference between two signals.

The output signals $y_1$ and $y_2$ of the FILs 3a and 3b are input to the pair of the multipliers 2a and 2b for multiplying by (modulating with) the timing signals of the timing signals of the timing signal generators 5b and 5c.

The output $z_1$ of the multiplier 2a is input to the adder 4 for adding to the output of the multiplier 6.

The output $z_2$ of the multiplier 2b and the output $z_1'$ of the adder 4 are input to MUX 15.

The multiplication (modulation) will be explained in more details.

It is assumed for the second embodiment that L=2 as the phase shift network 3 is a single unit, n=1 and, A=1 with above statements (1) and (2).

Accordingly, either the timing signal generators 5b or 5c generate timing signal expressed by:

$$(-1)^{k+1} \text{or} (-1)^k.$$

If the two timing signals are identical, an USB signal can be obtained.

For example, the timing signals are identical as denoted by:

$$(-1)^{K+1} = \{1,-1,1,-1\ldots \ldots\}$$

The two outputs $z_{u1}$ and $z_{u2}$ of the multipliers 2a and 2b are respectively expressed by:

$$z_{u1} = \{C \cdot \cos(\omega t + \theta)\} \times (-1)^{K+1}$$
$$= \{[C \cdot \cos(\omega 1 + \theta)], -[C \cdot \cos(\omega 3 + \theta)], [C \cdot \cos(\omega 5 + \theta)], \ldots\}$$

$$z_{u2} = \{-C \cdot \sin(\omega t + \theta)\} \times (-1)^{K+1}$$
$$= \{-[C \cdot \sin(\omega 2 + \theta)], [C \cdot \sin(\omega 4 + \theta)], -[C \cdot \sin(\omega 6 + \theta)], \ldots\}$$

Meanwhile, in the multiplier 6, constant B is multiplied by the timing signal from the timing signal generator 5b. The output $p_{u1}$ of the multiplier 6 is expressed by:

$$p_{u1} = B \cdot (-1)^{k+1}$$

The output $z_{u1}$ of the multiplier 2a is input to the adder 4, and the output $q_{u1}$ of the adder 4 is expressed by:

$$q_{u1} = \{C \cdot \cos(\omega t + \theta)\} \times (-1)^{K+1} + B \cdot (-1)^{k+1}$$
$$= \{[C \cdot \cos(\omega t + \theta) + B]\} \times (-1)^{K+1}$$
$$= \{[C \cdot \cos(\omega t + \theta) + B]\}, -[C \cdot \cos(\omega t 3 + \theta)], [C \cdot \cos(\omega t 5 + \theta)], \ldots\}$$

The output $z_{u2}$ of the multiplier 2b and the output $q_{u1}$ of the adder 4 are selected to produce digital modulated USB signal $z_u$ by MUX 15. The digital USB signal $z_u$ is expressed by:

$$z_u = \{[C \cdot \cos(\omega 1 + \theta) + B], -[C \cdot \sin(\omega 2 + \theta)], -[C \cdot \cos(\omega 3 + \theta) + B], [C \cdot \sin(\omega 4 + \theta)], [C \cdot \cos(\omega 5 + \theta) + B], -[C \cdot \sin(\omega 6 + \theta)], \ldots \ldots\}$$

The USB signal $z_u$ is converted to an analog USB signal as denoted by:

$$z_u = B \cdot \sin \omega c t + C \cdot \sin(\omega t + \theta + \omega_c t)$$

As apparent, $B \cdot \sin \omega_c t$ represents the carrier and $C \cdot \sin(\omega t + \theta + \omega_c t)$ represents the USB signal, where $\omega_c$ is angular frequency of the carrier (having a frequency fc which is equal to ¼ of sampling frequency fs).

The obtained modulated signal is a suppressed carrier USB signal when B=O, a low carrier USB signal when O<B<C, a full carrier USB signal when B=C.

Similarly, when the timing signals are identical as denoted by:

$$(-1)^K = \{-1,1,-1,1\ldots \ldots\}$$

such an USB signal will be obtained. When the timing signals are not identical or opposite to each other, an LSB signal will be obtained. More particularly, for example, the timing signals are not identical as denoted by:

$$(-1)^{K+1}=\{1,-1,1,-1\ldots\ldots\}$$

and $$(-1)^{K}=\{-1,1,-1,1\ldots\ldots\}$$

The two outputs $z_{l1}$ and $z_{l2}$ of the multipliers $2a$ and $2b$ are expressed by:

$$\begin{aligned}
y_{l1} &= \{C \cdot \cos(\omega t + \theta) + B\} \times (-1)^{K+1} \\
&= \{[C \cdot \cos(\omega 1 + \theta) + B], -[C \cdot \cos(\omega 3 + \theta) + \\
&\quad B], [C \cdot \cos(\omega 5 + \theta) + B], \ldots\} \\
y_{l2} &= \{-C \cdot \sin(\omega t + \theta)\} \times (-1)^{K} \\
&= \{[C \cdot \sin(\omega 2 + \theta)], -[C \cdot \sin(\omega 4 + \theta)], \\
&\quad [C \cdot \sin(\omega 6 + \theta)], \ldots\}
\end{aligned}$$

Meanwhile, in the multiplier 6, a constant B is multiplied by the timing signal from the timing signal generator $5b$. The output $p_{l1}$ of the multiplier 6 is expressed by:

$$p_{l1}=B\cdot(-1)^{k+1}$$

The output $z_{l1}$ of the multiplier $2a$ is input to adder 4, and the output $q_{u1}$ of the adder 4 is expressed by:

$$\begin{aligned}
q_{l1} &= \{C \cdot \cos(\omega t + \theta)\} \times (-1)^{K+1} + B \cdot (-1)^{k+1} \\
&= \{[C \cdot \cos(\omega t + \theta) + B]\} \times (-1)^{K+1} \\
&= \{[C \cdot \cos(\omega 1 + \theta) + B]\}, -[C \cdot \cos(\omega 3 + \theta + B)], \\
&\quad [C \cdot \cos(\omega 5 + \theta) + B], \ldots\}
\end{aligned}$$

The output $z_{l2}$ of the multiplier $2b$ and the output $q_{l1}$ of the adder 4 are selected to produce digital modulated LSB signal $z_l$ by MUX 15.

The digital LSB signal $z_l$ is expressed by:

$$z_l=\{[C\cdot\cos(\omega 1+\theta)+B],[C\cdot\sin(\omega 2+\theta)],-[C\cdot\cos(\omega 3+\theta)+B],\\-[C\cdot\sin(\omega 4+\theta)],-[C\cdot\cos(\omega 5+\theta)+B],[C\cdot\sin(\omega 6+\theta)],\ldots\ldots\}$$

The digital LSB signal $z_l$ is converted to an analog LSB signal as denoted by:

$$z_l=B\cdot\sin\omega_c t+C\cdot\sin(\omega t+\theta-\omega_c t)$$

As apparent, $B\cdot\sin\omega_c t$ represents the carrier and $C\cdot\sin(\omega t+\theta-\omega_c t)$ represents the LSB signal, where $\omega_c$ is angular frequency of the carrier (having a frequency fc which is equal to ¼ of sampling frequency fs).

The obtained modulated signal is a suppressed carrier LSB signal when B=O, a low carrier LSB signal when O<B<C, a full carrier LSB signal when B=C.

Embodiment 3

Figure 8:
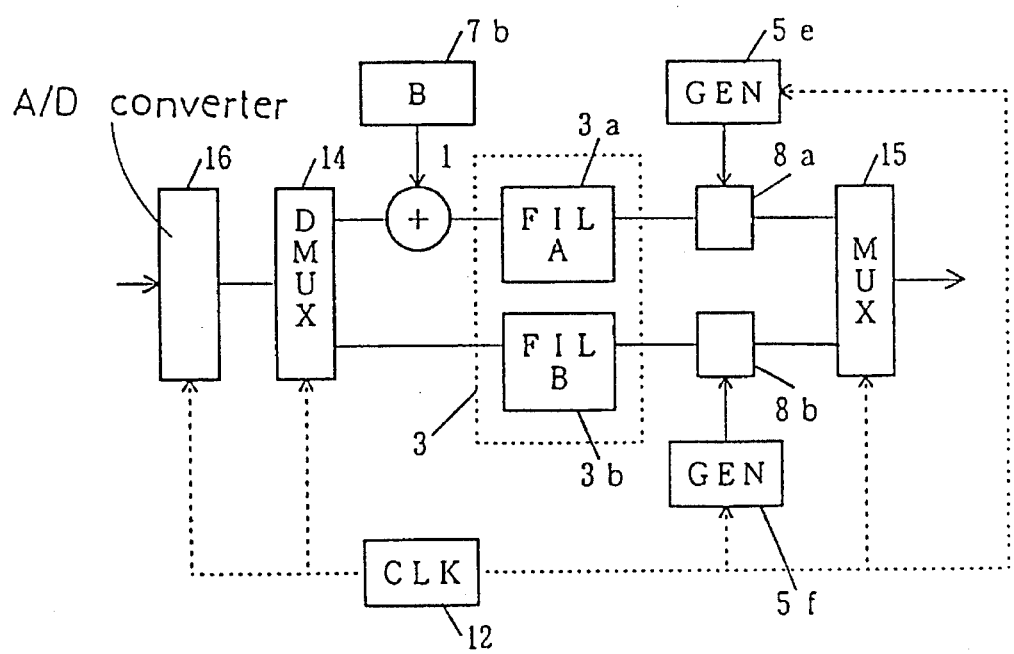
FIG. 8 is a block diagram of an SSB modulator according to the third embodiment of the present invention.

FIG. 8 is a block diagram of an SSB modulator according to the third embodiment of the present invention, in which only one phase shift network (L=2, n=1) is provided in the simplest circuit arrangement.

In the third embodiment, the pair of multipliers $2a$ and $2b$ of the first embodiment are replaced by two control circuits $8a$ and $8b$, and the timing signals of the timing signal generators $5e$ and $5f$ are as denoted in the statements (3) and (4) of the summary of the invention.

The timing signals of the timing signal generators $5e$ and $5f$ are input to the control circuits $8a$ and $8b$ for controlling the signs of the outputs of the FILs $3a$ and $3b$ in the phase shift network 3. More particularly, control circuits $8a$ and $8b$ control the signs of input signals which are inverted when the timing signal is 1 and remain unchanged when it is 0.

It is assumed for the third embodiment that L=2 as the phase shift network 3 is a single unit, n=1 and, A=1 with above statements (3) and (4).

Accordingly, either the timing signal generators $5e$ or $5f$ generate the timing signal expressed by:

$$\{1,0,1,0,\ldots\ldots\}\text{ or }\{0,1,0,1,\ldots\ldots\}$$

If the two timing signals are identical, an USB signal can be obtained.

For example, the timing signals are identical as denoted by:

$$\{1+(-1)^{K+1}\}/2=\{0,1,0,1\ldots\ldots\}$$

The two signals $x_1'(t_1)$ and $x_2(t_2)$ are input to the FILs $3a$ and $3b$, the outputs $y_1$ and $y_2$ of the FILs $3a$ and $3b$ are expressed by:

$$\begin{aligned}
y_1 &= \{C \cdot \cos(\omega 1 + \theta) + B, C \cdot \cos(\omega 3 + \theta) + \\
&\quad B, C \cdot \cos(\omega 5 + \theta) + B, \ldots\} \\
y_2 &= \{C \cdot \cos(\omega 2 + \theta + \pi/2), C \cdot \cos(\omega 4 + \theta + \pi/2), \\
&\quad C \cdot \cos(\omega 6 + \theta + \pi/2), \ldots\} \\
&= \{-C \cdot \sin(\omega 2 + \theta), -C \cdot \sin(\omega 4 + \theta), -\\
&\quad C \cdot \sin(\omega 6 + \theta), \ldots\}
\end{aligned}$$

In the control circuits $8a$ and $8b$, the signs of the outputs $y_1$ and $y_2$ of the FILs $3a$ and $3b$ in the phase shift network 3 are inverted when the timing signal is 1 and remain unchanged when it is 0. The outputs $z_{u1}$ and $z_{u2}$ of the control circuits $8a$ and $8b$ are expressed by:

$$z_{u1}=\{[C\cdot\cos(\omega 1+\theta)+B],-[C\cdot\cos(\omega 3+\theta)+B],[C\cdot\cos(\omega 5+\theta)+B],\ldots\ldots\}$$

$$z_{u2}=\{-[C\cdot\sin(\omega 2+\theta)],[C\cdot\sin(\omega 4+\theta)],-[C\cdot\sin(\omega 6+\theta)],\ldots\ldots\}$$

The two outputs $z_{u1}$ and $z_{u2}$ of the control circuits $8a$ and $8b$ are selected to produce digital modulated USB signal $z_u$ by MUX 15.

The digital USB signal $z_u$ is expressed by:

$$z_u=\{[C\cdot\cos(\omega 1+\theta)+B],-[C\cdot\sin(\omega 2+\theta)],-[C\cdot\cos(\omega 3+\theta)+B],\\ [C\cdot\sin(\omega 4+\theta)],[C\cdot\cos(\omega 5+\theta)+B],-[C\cdot\sin(\omega 6+\theta)],\ldots\ldots\}$$

The digital USB signal $z_u$ is converted to an analog USB signal as denoted by:

$$z_u=B\cdot\sin\omega_c t+C\cdot\sin(\omega t+\theta+\omega_c t)$$

As apparent, $B\cdot\sin\omega_c t$ represents the carrier and $C\cdot\sin(\omega t+\theta+\omega_c t)$ represents the USB signal, where $\omega_c$ is angular frequency of the carrier (having a frequency fc which is equal to ¼ of sampling frequency fs).

The obtained modulated signal is a suppressed carrier USB signal when B=O, a low carrier USB signal when O<B<C, a full carrier USB signal when B=C.

Similarly, when the timing signals are identical as denoted by:

$$\{1,0,1,0\ldots\ldots\}$$

such an USB signal will be obtained.

When the timing signals are not identical or opposite to each other, an LSB signal will be obtained. More particularly, for example, the timing signals are not identical as denoted by:

{0,1,0,1,... ...} and {1,0,1,0,... ...}

The two outputs $z_{l1}$ and $z_{l2}$ of the control circuits 8a and 8b are respectively:

$z_{l1}$={[C·cos(ω1+θ)+B],−[C·cos(ω3+θ)+B],[C·cos(ω5+θ)+B],... ...}

$z_{l2}$={[C·sin(ω2+θ)],−[C·sin(ω4+θ)],[C·sin(ω6+θ)],... ...}

The two outputs $z_{l1}$ and $z_{l2}$ of the control circuits 8a and 8b are selected to produce digital modulated LSB signal $z_l$ by MUX 15.

The digital LSB signal $z_l$ is expressed by:

$z_l$={[C·cos(ω1+θ)+B],[C·sin(ω2+θ)],−[C·cos(ω3+θ)+B],
−[C·sin(ω4+θ)],[C·cos(ω5+θ)+B],[C·sin(ω6+θ)],... ...}

The digital LSB signal $z_l$ is converted to an analog LSB signal as denoted by:

$z_l$=B·sinω$_c$t+C·sin(ωt+θ−ω$_c$t)

As apparent, B·sin ω$_c$t represents the carrier and C·sin (ωt+θ−ω$_c$t) represents the LSB signal.

The obtained modulated signal is a suppressed carrier LSB signal when B=O, a low carrier LSB signal when O<B<C, a full carrier LSB signal when B=C.

Embodiment 4

Figure 11:
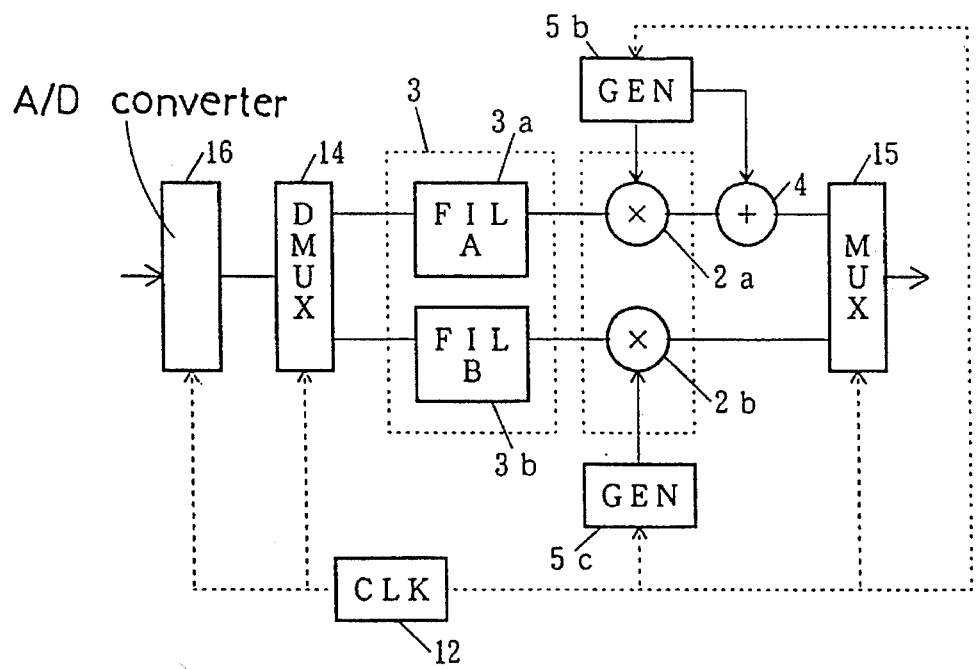
FIG. 11 is a block diagram of an SSB modulator according to the fourth embodiment of the present invention.

FIG. 11 is a block diagram of an SSB modulator according to the fourth embodiment of the present invention, in which only one phase shift network (L=2, n=1) is provided in the simplest circuit arrangement.

In the fourth embodiment, the constant generator 7b and the multiplier 6 of the second embodiment are eliminated and the timing signal of the timing signal generator 5b is directly input to the adder 4.

If the two timing signals are identical, an USB signal can be obtained.

For example, the timing signals are identical as denoted by:

$(-1)^{K+1}$={1,−1,1,−1... ...}

The two outputs $z_{u1}$ and $z_{u2}$ of the multipliers 2a and 2b are respectively expressed by:

$$z_{u1} = \{C \cdot \cos(\omega t + \theta)\} \times (-1)^{K+1}$$
$$= \{[C \cdot \cos(\omega 1 + \theta)], -[C \cdot \cos(\omega 3 + \theta)],$$
$$[C \cdot \cos(\omega 5 + \theta)], \ldots \}$$
$$z_{u2} = \{-C \cdot \sin(\omega t + \theta)\} \times (-1)^{K+1}$$
$$= \{-[C \cdot \sin(\omega 2 + \theta)], [C \cdot \sin(\omega 4 + \theta)], -$$
$$[C \cdot \sin(\omega 6 + \theta)], \ldots \}$$

The output $y_{u1}$ of the multiplier 2a is input to the adder 4, and the output $r_{u1}$ of the adder 4 is expressed by:

$$r_{u1} = \{C \cdot \cos(\omega t + \theta)\} \times (-1)^{K+1} + (-1)^{k+1}$$
$$= \{[C \cdot \cos(\omega t + \theta) + 1]\} \times (-1)^{K+1}$$
$$= \{[C \cdot \cos(\omega 1 + \theta) + 1]\}, -[C \cdot \cos(\omega 3 + \theta) + 1],$$
$$[C \cdot \cos(\omega 5 + \theta) + 1], \ldots \}$$

The output $z_{u2}$ of the multiplier 2b and the output $r_{u1}$ of the adder 4 are selected to produce digital modulated USB signal $z_u$ by MUX 15.

The digital USB signal $z_u$ is expressed by:

$z_u$={[C·cos(ω1+θ)+1], −[C·sin(ω2+θ)],−[C·cos(ω3+θ)+1],
[C·sin(ω4+θ)],[C·cos(ω5+θ)+1],−[C·sin(ω6+θ)],... ...}

The digital USB signal $z_u$ is converted to an analog USB signal as denoted by:

$z_u$=B·sinω$_c$t+C·sin(ωt+θ+ω$_c$t)

As apparent, B·sin ω$_c$t represents the carrier and C·sin(ωt+θ+ω$_c$t) represents the USB signal, where ω$_c$ is angular frequency of the carrier (having a frequency fc which is equal to ¼ of sampling frequency fs).

The obtained modulated signal is a low carrier USB signal when C>1, a full carrier USB signal when C=1.

Similarly, when the timing signals are identical as denoted by:

$(-1)^K$={−1,1,−1,1... ...} such an USB signal will be obtained.

When the timing signals are not identical or opposite to each other, an LSB signal will be obtained.

More particularly, for example, the timing signals are not identical as denoted by:

$(-1)^{K+1}$={1,−1,1,−1... ...} and $(-1)^K$={−1,1,−1,1... ...}

The two outputs zl1 and zl2 of the multipliers 2a and 2b are expressed by:

$$z_{l1} = \{C \cdot \cos(\omega t + \theta) + B\} \times (-1)^{K+1}$$
$$= \{[C \cdot \cos(\omega 1 + \theta) + B], -[C \cdot \cos(\omega 3 + \theta) +$$
$$B], [C \cdot \cos(\omega 5 + \theta) + B], \ldots \}$$
$$z_{l2} = \{-C \cdot \sin(\omega t + \theta)\} \times (-1)^K$$
$$= \{[C \cdot \sin(\omega 2 + \theta)], -[C \cdot \sin(\omega 4 + \theta)],$$
$$[C \cdot \sin(\omega 6 + \theta)], \ldots \}$$

The output $z_{l1}$ of the multiplier 2a is input to adder 4, and the output $r_{l1}$ of the adder 4 is expressed by:

$$q_{l1} = \{C \cdot \cos(\omega t + \theta)\} \times (-1)^{K+1} + (-1)^{k+1}$$
$$= \{[C \cdot \cos(\omega t + \theta) + B]\} \times (-1)^{K+1}$$
$$= \{[C \cdot \cos(\omega 1 + \theta) + B]\}, -[C \cdot \cos(\omega 3 + \theta)],$$
$$[C \cdot \cos(\omega 5 + \theta)], \ldots \}$$

The output $y_{l2}$ of the multiplier 2b and the output $r_{l1}$ of the adder 4 are selected to produce digital modulated LSB signal $z_u$ by MUX 15.

The digital LSB signal $z_l$ is expressed by:

$z_l$={[C·cos(ω1+θ)+B],[C·sin(ω2+θ)],−[C·cos(ω3+θ)+B],
−[C·sin(ω4+θ)], −[C·cos(ω5+θ)+B], [C·sin(ω6+θ)],... ...}

The digital LSB signal zl is converted to an analog LSB signal as denoted by:

$z_l$=B·sinω$_c$t+C·sin(ωt+θ−ω$_c$t)

As apparent, B·sin ω$_c$t represents the carrier and C·sin(ωt+θ−ω$_c$t) represents the LSB signal, where ω$_c$ is angular frequency of the carrier (having a frequency fc which is equal to ¼ of sampling frequency fs).

The obtained modulated signal is a low carrier LSB signal when C>1, a full carrier LSB signal when C=1.

Embodiment 5

Figure 12:
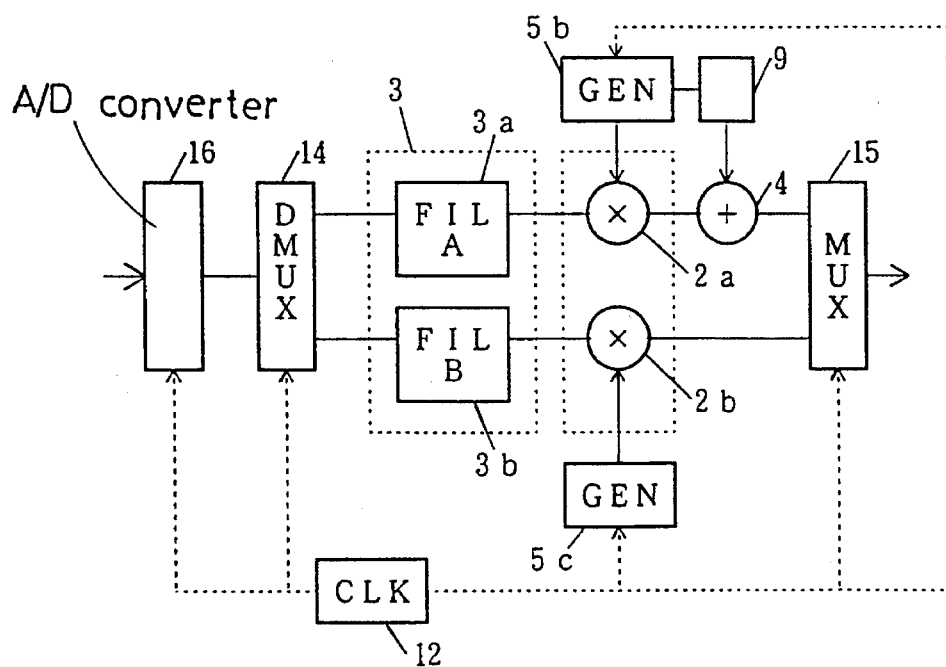
FIG. 12 is a block diagram of an SSB modulator according to the fifth embodiment of the present invention.
Figure 13:
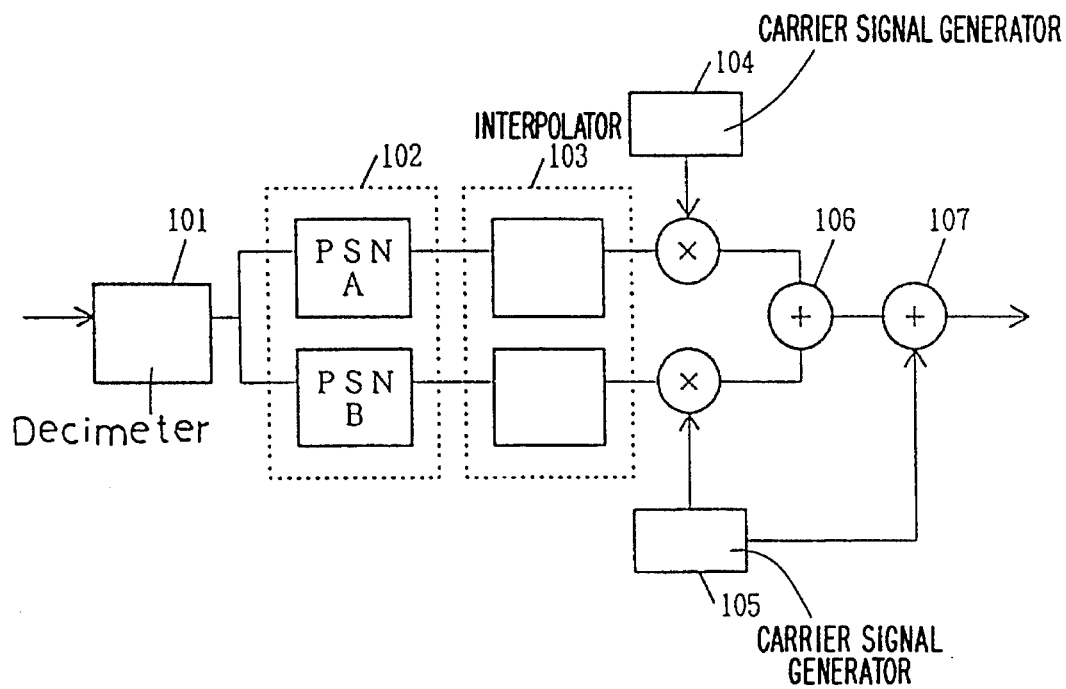
FIG. 13 is a block diagram of a conventional digital SSB modulator which using a decimeter and a interpolator.

FIG. 12 is a block diagram of an SSB modulator according to the fifth embodiment of the present invention, in which only one phase shift network (L=2, n=1) is provided in the simplest circuit arrangement.

In the embodiment 5, the constant generator 7b and the multiplier 6 of the second embodiment are replaced by a bit shift circuit 9.

If the two timing signals are identical, an USB signal can be obtained.

For example, if A=2, the timing signals are identical as denoted by:

$$A(-1)^{(KL)/2+n} = 2 \times (-1)^{K+1} = \{2, -2, 2, -2 \ldots \ldots\}$$

It is now assumed that four bits of digital data are subject to digital processing in this SSB modulator.

Accordingly, the timing signal is [0010](=2) when A=2. The timing signal is input to the bit shift circuit 9.

When the timing signal is bit shifted to rightword, an USB signal will be obtained.

For example, the timing signal is bit shifted to [0001]. As a result, the timing signal is reduced to ½.

When an analog input signal of the A/D converter 16 is a C·cos ωt, C=2.

Because, C equals A in the SSB modulator of the embodiment 5.

Accordingly, the output of the bit shift circuit 9 is expressed by:

$$(-1)^{K+1}$$

The output zu1 of the multiplier 2a is input to the adder 4, and the output $s_{u1}$ of the adder 4 is expressed by:

$$\begin{aligned}
s_{u1} &= \{2 \cdot \cos(\omega t + \theta)\} \times (-1)^{K+1} + (-1)^{k+1} \\
&= \{[2 \cdot \cos(\omega t + \theta)] + 1]\} \times (-1)^{K+1} \\
&= \{[2 \cdot \cos(\omega 1 + \theta) + 1]\}, -[2 \cdot \cos(\omega 3 + \theta) + 1], \\
&\quad [2 \cdot \cos(\omega 5 + \theta) + 1], \ldots \}
\end{aligned}$$

The output $z_{u2}$ of the multiplier 2b and the output $s_{u1}$ of the adder 4 are selected to produce the digital modulated USB signal $z_u$ by MUX 15.

The digital USB signal $z_u$ is expressed by:

$$z_u = \{[2 \cdot \cos(\omega 1 + \theta) + 1], -[2 \cdot \sin(\omega 2 + \theta)], -[2 \cdot \cos(\omega 3 + \theta) + 1], [2 \cdot \sin(\omega 4 + \theta)], [2 \cdot \cos(\omega 5 + \theta) + 1], -[2 \cdot \sin(\omega 6 + \theta)], \ldots \ldots\}$$

The USB signal $z_u$ is converted to an analog USB signal as denoted by:

$$z_u = \sin\omega_c t + 2 \cdot \sin(\omega t + \theta + \omega_c t)$$

As apparent, sin $\omega_c t$ represents the carrier and $2 \cdot \sin(\omega t + \theta + \omega_c t)$ represents the USB signal, where $\omega_c$ is angular frequency of the carrier (having a frequency fc which is equal to ¼ of sampling frequency fs).

In this case, the obtained modulated signal is a low carrier USB signal.

If the timing signal is not bit shifted by the bit shift circuit 9, the obtained modulated signal is a full carrier USB signal.

When the timing signal is bit shifted to leftword, an LSB signal or a RZ-SSB signal will be obtained. For example, the timing signal is bit shifted to [0100].

The output $y_{u1}$ of the multiplier 2a is input to the adder 4, and the output $s_{l1}$ of the adder 4 is expressed by:

$$\begin{aligned}
s_{l1} &= \{2 \cdot \cos(\omega t + \theta)\} \times (-1)^{K+1} + (-1)^{k+1} \\
&= \{[2 \cdot \cos(\omega t + \theta)] + 4]\} \times (-1)^{K+1} \\
&= \{[2 \cdot \cos(\omega 1 + \theta) + 4]\}, -[2 \cdot \cos(\omega 3 + \theta) + 4], \\
&\quad [2 \cdot \cos(\omega 5 + \theta) + 4], \ldots \}
\end{aligned}$$

The output $z_{l2}$ of the multiplier 2b and the output $s_{l1}$ of the adder 4 are selected to produce digital modulated LSB signal $y_u$ by MUX 15.

The digital LSB signal $z_l$ is expressed by:

$$z_l = \{[2 \cdot \cos(\omega 1 + \theta) + 4], [2 \cdot \sin(\omega 2 + \theta)], -[2 \cdot \cos(\omega 3 + \theta) + 4], -[2 \cdot \sin(\omega 4 + \theta)], -[2 \cdot \cos(\omega 5 + \theta) + 4], [2 \cdot \sin(\omega 6 + \theta)], \ldots \ldots\}$$

The digital LSB signal $z_l$ is converted to an analog LSB signal as denoted by:

$$z_l = 4 \cdot \sin\omega_c t + 2 \cdot \sin(\omega t + \theta - \omega_c t)$$

As apparent, $4 \cdot \sin \omega_c t$ represents the carrier and $2 \cdot \sin(\omega t + \theta - \omega_c t)$ represents the LSB signal, where $\omega_c$ is angular frequency of the carrier (having a frequency fc which is equal to ¼ of sampling frequency fs).

We claim:

1. An SSB modulator comprising:

a demultiplexer means for successively distributing an A/D converted digital signal x(t) to L sequences $x_1(t_1)$, $x_2(t_2) \ldots \ldots x_L(t_L)$ in accordance with a sampling period t, wherein $$\begin{aligned}
x_1(t_1) &= x(t) & t_1 &= [(t-1)/L] \\
x_2(t_2) &= x(t) & t_2 &= [(t-2)/L] \\
&\ldots \\
x_L(t_L) &= x(t) & t_L &= [(t-L)/L]
\end{aligned}$$

and

[.] expresses a positive integer number;

an adding means comprising L/2 adders for adding constants to $x_i(t_i)$ of the demultiplexer means, where i is either an even or an odd number;

a phase shift network system means comprising L/2 phase shift networks for making a 90-degree phase difference between the outputs of the adding means and $x_i(t_i)$ of the demultiplexer means;

a timing signals generating means for generating timing signals expressed by:

$$A(-1)^{(KL)/2+n}$$

and/or $$A(-1)^{((K-1)L)/2+n}$$

in accordance with the sampling period t;

a multiplying means comprising L/2 pair of multipliers for multiplying the outputs of the phase shift network system means by the outputs of the timing signals generating means;

a multiplexer means for selecting the outputs of the multiplying means in accordance with the sampling period;

wherein [(t−1)/L], [(t−2)/L], ..., [(t−L)/L] are positive integer numbers, A represents a fixed number, L represents an even number indicating the number of outputs of the demultiplexer means, n represents the number of phase shift networks and pair of multipliers (n=1 to L/2), K represents the number of periods of distributing by the demultiplexer means, and t represents the sampling period (t=1,2,3,... ...).

2. An SSB modulator comprising:

a demultiplexer means for successively distributing an A/D converted digital signal x(t) to L sequences $x_1(t_1)$, $x_2(t_2)$... ...$x_L(t_L)$ in accordance with a sampling period t, wherein $$x_1(t_1) = x(t) \quad t_1 = [(t-1)/L]$$
$$x_2(t_2) = x(t) \quad t_2 = [(t-2)/L]$$
$$...$$
$$x_L(t_L) = x(t) \quad t_L = [(t-L)/L]$$

and

[.] expresses a positive integer number;

a phase shift network system means comprising L/2 phase shift networks for making a 90-degree phase difference between $x_{2j-1}(t_{2j-1})$ and $x_{2j}(t_{2j})$, where j=1,2, ... ...L/2;

an adding means comprising L/2 adders for adding constants to one of the two kinds of outputs of the phase shift network system means;

a timing signals generating means for generating timing signals expressed by $$A(-1)^{(KL)/2+n}$$

and/or $$A(-1)^{((K-1)L)/2+n}$$

in accordance with the sampling period t;

a multiplying means comprising L/2 pair of multipliers for multiplying the outputs of the adding means and the other of the two kinds of outputs of the phase shift network system means by the outputs of the timing signals generating means;

a multiplexer means for selecting the outputs of the multiplying means in accordance with the sampling period t;

wherein [(t−1)/L], [(t−2)/L],... ..., [(t−L)/L] are positive integer numbers, A represents a fixed number, L represents an even number indicating the number of outputs of the demultiplexer means, n represents the number of phase shift networks and pair of multipliers (n=1 to L/2), K represents the number of periods of distributing by the demultiplexer means, and t represents the sampling period (t=1,2,3,... ...).

3. An SSB modulator comprising:

a demultiplexer means for successively distributing an A/D converted digital signal x(t) to L sequences $x_1(t_1)$, $x_2(t_2)$... ...$x_L(t_L)$ in accordance with a sampling period t, wherein $$x_1(t_1) = x(t) \quad t_1 = [(t-1)/L]$$
$$x_2(t_2) = x(t) \quad t_2 = [(t-2)/L]$$
$$...$$
$$x_L(t_L) = x(t) \quad t_L = [(t-L)/L]$$

and

[.] expresses a positive integer number;

a phase shift network system means comprising L/2 phase shift networks for making a 90-degree phase difference between $x_{2j-1}(t_{2j-1})$ and $x_{2j}(t_{2j})$, where j=1,2,... ...L/2;

a timing signals generating means for generating timing signals expressed by $$A(-1)^{(KL)/2+n}$$

and/or $$A(-1)^{((K-1)L)/2+n}$$

in accordance with the sampling period t;

a first multiplying means comprising L/2 pair of multipliers for multiplying the two kinds of outputs of the phase shift network system means by the outputs of the timing signals generating means;

a second multiplying means comprising a multiplier for multiplying a constant by one of the outputs of the timing signals generating means;

an adding means comprising L/2 adders for adding one of the two kinds of outputs of the first multiplying means to an output of the second multiplying means;

a multiplexer means for selecting the other of the two kinds of outputs of the first multiplying means and the outputs of the adding means in accordance with the sampling period t;

wherein [t−1)/L], [(t−2)/L],... ...,[(t−L)/L] are positive integer numbers, A represents a fixed number, L represents an even number indicating the number of outputs of the demultiplexer means, n represents the number of phase shift networks and pair of multipliers (n=1 to L/2), K represents the number of periods of distributing by the demultiplexer means, and t represents the sampling period (t=1,2,3,... ...).

4. a demultiplexer means for successively distributing an A/D converted digital signal x(t) to L sequences $x_1(t_1)$, $x_2(t_2)$... ...$x_L(t_L)$ in accordance with a sampling period t, wherein $$x_1(t_1) = x(t) \quad t_1 = [(t-1)/L]$$
$$x_2(t_2) = x(t) \quad t_2 = [(t-2)/L]$$
$$...$$
$$x_L(t_L) = x(t) \quad t_L = [(t-L)/L]$$

and

[.] expresses a positive integer number;

an adding means comprising L/2 adders for adding constants to $x_i(t_i)$ of the demultiplexer means, where i is either an even or an odd number;

a phase shift network system means comprising L/2 phase shift networks for making a 90-degree phase difference between the output of the adding means and $x_j(t_j)$ of the demultiplexer means, a timing signals generating means for generating timing signals expressed by $$\{1+(-1)^{(KL)/2+n}\}/2$$

and/or $$\{1+(-1)^{((K-1)L)/2+n}\}/2$$

in accordance with the sampling period t;

a control means comprising L/2 pair of control circuits for controlling the signs of the two kinds of outputs of the phase shift network system means and the outputs of the adding means in accordance with the outputs of the timing signals generating means;

a multiplexer means for selecting the outputs of the control means in accordance with the sampling period t;

wherein $[(t-1)/L]$, $[(t-2)/L],\ldots \ldots,[(t-L)/L]$ are positive integer numbers, A represents a fixed number, L represents an even number indicating the number of outputs of the demultiplexer means, n represents the number of phase shift networks and pair of control circuits (n=1 to L/2), K represents the number of periods of distributing by the demultiplexer means, and t represents a sampling period (t=1,2,3,... ...).

5. An SSB modulator comprising:

a demultiplexer means for successively distributing an A/D converted digital signal x(t) to L number of sequences $x_1(t_1)$, $x_2(t_2)\ldots \ldots x_L(t_L)$ in accordance with the sampling period t, wherein $x_1(t_1) = x(t) \quad t_1 = [(t-1)/L]$ $x_2(t_2) = x(t) \quad t_2 = [(t-2)/L]$ $\ldots$ $x_L(t_L) = x(t) \quad t_L = [(t-L)/L]$ and [.] expresses a positive integer number;

a phase shift network system means comprising L/2 phase shift networks for making a 90-degree phase difference between $x_{2j-1}(t_{2j-1})$ and $x_{2j}(t_{2j})$, where j=1,2,... ...L/2;

an adding means comprising L/2 adders for adding constants to one of the two kinds of outputs of the phase shift network system means;

a timing signals generating means for generating timing signals expressed by $$\{1+(-1)^{(KL)/2+n}\}/2$$

and/or $$\{1+(-1)^{((K-1)L)2+n}\}/2$$

in accordance with the sampling period t;

a control means comprising L/2 pair of control circuits for controlling the signs of the other of the two kinds of outputs of the phase shift network system means and the outputs of the adding means in accordance with the outputs of the timing signals generating means;

a multiplexer means for selecting the outputs of the control means in accordance with the sampling period t;

wherein $[(t-1)/L]$, $[(t-2)/L],\ldots \ldots, [(t-L)/L]$ are positive integer numbers, A represents a fixed number, L represents an even number indicating the number of outputs of the demultiplexer means, n represents the number of phase shift networks and pair of control circuits (n=1 to L/2), K represents the number of periods of distributing by the demultiplexer means, and t represents the sampling period (t=1,2,3,... ...).

6. An SSB modulator comprising:

a demultiplexer means for successively distributing an A/D converted digital signal x(t) to L of sequences $x_1(t_1)$, $x_2(t_2)\ldots \ldots x_L(t_L)$ in accordance with a sampling period t, wherein $x_1(t_1) = x(t) \quad t_1 = [(t-1)/L]$ $x_2(t_2) = x(t) \quad t_2 = [(t-2)/L]$ $\ldots$ $x_L(t_L) = x(t) \quad t_L = [(t-L)/L]$ and

[.] expresses a positive integer number;

a phase shift network system means comprising L/2 phase shift networks for making a 90-degree phase difference between $x_{2j-1}(t_{2j-1})$ and $x_{2j}(t_{2j})$, where j=1,2,... ...L/2;

a timing signals generating means for generating timing signals expressed by $$A(-1)^{(KL)/2+n}$$

and/or $$A(-1)^{((K-1)L)/2+n}$$

in accordance with the sampling period t;

a multiplying means comprising L/2 pair of multipliers for multiplying the two kinds of outputs of the phase shift network system means by the outputs of the timing signals generating means;

an adding means comprising L/2 adders for adding one of the two kinds of outputs of the first multiplying means to one of the outputs of the timing signals generating means;

a multiplexer means for selecting the other of the two kinds of outputs of the multiplying means and the outputs of the adding means in accordance with the sampling period t;

wherein $[(t-1)/L]$, $[(t-2)/L],\ldots \ldots,[(t-L)/L$ ] are positive integer numbers, A represents a fixed number, L represents an even number indicating the number of outputs of the demultiplexer means, n represents the number of phase shift networks and pair of multipliers (n=1 to L/2), K represents the number of periods of distributing by the demultiplexer means, and t represents the sampling period (t=1,2,3,... ...).

7. An SSB modulator comprising:

a demultiplexer means for successively distributing an A/D converted digital signal x(t) to L of sequences $x_1(t_1)$, $x_2(t_2)\ldots \ldots x_L(t_L)$ in accordance with a sampling period t, wherein $x_1(t_1) = x(t) \quad t_1 = [(t-1)/L]$ $x_2(t_2) = x(t) \quad t_2 = [(t-2)/L]$ $\ldots$ $x_L(t_L) = x(t) \quad t_L = [(t-L)/L]$ and

[.] expresses a positive integer number;

a phase shift network system means comprising L/2 phase shift networks for making a 90-degree phase difference between $x_{2j-1}(t_{2j-1})$ and $x_{2j}(t_{2j})$, where j=1,2,... ...L/2;

a timing signals generating means for generating timing signals expressed by $$A(-1)^{(KL)/2+n}$$

and/or $$A(-1)^{((K-1)L)2+n}$$

in accordance with the sampling period t;

a multiplying means comprising L/2 pair of multipliers for multiplying the two kinds of outputs of the phase shift network system means by the outputs of the timing signals generating means;

a bit shift means for shifting the bit of one of the outputs of the timing signals generating means;

an adding means comprising L/2 adders for adding one of the two kinds of outputs of the multiplying means to the bit shift means;

a multiplexer means for selecting the other of the two kinds of outputs of the multiplying means and the outputs of the adding means in accordance with the sampling period t;

wherein $[(t-1)/L]$, $[(t-2)/L],\ldots \ldots,[(t-L)/L]$ are positive integer numbers, A represents a fixed number, L represents an even number indicating the number of outputs of the demultiplexer means, n represents the number of phase shift networks and pair of multipliers (n=1 to L/2), K represents the number of periods of distributing by the demultiplexer means, and t represents the sampling period (t=1,2,3,... ...).

* * * * *

UNITED STATES PATENT AND TRADEMARK OFFICE
CERTIFICATE OF CORRECTION

PATENT NO. : 5,506,548
DATED : April 9, 1996
INVENTOR(S) : Shigeki KAJIMOTO

It is certified that error appears in the above-indentified patent and that said Letters Patent is hereby corrected as shown below:

Column 1, line 10, after "hereinafter" insert --)--.

Column 4, line 60, rewrite as:

$$--\{1+(-1)^{((K-1)L)/2+n}\}/2--$$

Column 19, line 50, rewrite as:

$$--x_1(t_1) = \{C \cdot \cos\omega1, C \cdot \cos\omega3, C \cdot \cos\omega5, \cdots\cdots\}--.$$

Column 30, line 25, change "$[t-1)/L]$" to --$[(t-1)/L]$--.

Signed and Sealed this

Twenty-fifth Day of March, 1997

Attest:

BRUCE LEHMAN

*Attesting Officer*   Commissioner of Patents and Trademarks

UNITED STATES PATENT AND TRADEMARK OFFICE
CERTIFICATE OF CORRECTION

PATENT NO. : 5,506,548
DATED : April 9, 1996
INVENTOR(S) : Shigeki KAJIMOTO

It is certified that error appears in the above-indentified patent and that said Letters Patent is hereby corrected as shown below:

Column 30, line 47, change "$x_1(t_1)$" to --$x_i(t_i)$--.

Signed and Sealed this

Twentieth Day of May, 1997

BRUCE LEHMAN

Attest:

Attesting Officer

Commissioner of Patents and Trademarks